United States Patent
Kadowaki et al.

(10) Patent No.: US 10,281,766 B2
(45) Date of Patent: May 7, 2019

(54) LIGHTING DEVICE AND DISPLAY DEVICE

(71) Applicant: Sharp Kabushiki Kaisha, Sakai, Osaka (JP)

(72) Inventors: Shinya Kadowaki, Sakai (JP); Ryuzo Yuki, Sakai (JP); Mitsuhiro Murata, Sakai (JP); Takeshi Ishida, Sakai (JP); Takeshi Masuda, Sakai (JP); Hisashi Watanabe, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 43 days.

(21) Appl. No.: 15/539,322

(22) PCT Filed: Dec. 18, 2015

(86) PCT No.: PCT/JP2015/085478
§ 371 (c)(1),
(2) Date: Jun. 23, 2017

(87) PCT Pub. No.: WO2016/104357
PCT Pub. Date: Jun. 30, 2016

(65) Prior Publication Data
US 2017/0351143 A1    Dec. 7, 2017

(30) Foreign Application Priority Data

Dec. 26, 2014  (JP) ................. 2014-265559

(51) Int. Cl.
*G02F 1/1335* (2006.01)
*F21V 8/00* (2006.01)
(Continued)

(52) U.S. Cl.
CPC ...... *G02F 1/133603* (2013.01); *F21V 23/001* (2013.01); *F21V 23/0442* (2013.01);
(Continued)

(58) Field of Classification Search
CPC ............................................. G02F 1/133603
See application file for complete search history.

(56) References Cited

U.S. PATENT DOCUMENTS

2006/0061286 A1  3/2006  Coushaine et al.
2007/0147012 A1  6/2007  Tanaka
(Continued)

FOREIGN PATENT DOCUMENTS

JP    H07-283563 A    10/1995
JP    2005-129552 A    5/2005
(Continued)

*Primary Examiner* — Edmond C Lau
(74) *Attorney, Agent, or Firm* — ScienBiziP, P.C.

(57) ABSTRACT

A backlight device 12 includes at least: a plurality of LEDs 17 arranged in an annular and curved shape; a light guide plate 14 surrounded by the plurality of LEDs 17 having am outer shape along the arrangement of the plurality of LEDs 17, and guiding light from the plurality of LEDs 17; and an LED board (light source board) 18 on which the plurality of LEDs 17 are mounted and wiring portions 18c for feeding power to the plurality of LEDs 17 are formed. The LED board 18 extends along the arrangement of the plurality of LEDs 17, and has a terminated annular shape or an endless annular shape, and includes a no-wiring formed region NWA in a part with respect to the circumferential direction thereof, where the wiring portions 18c are not formed.

15 Claims, 21 Drawing Sheets

(51) Int. Cl.
| | | |
|---|---|---|
| *F21V 23/00* | (2015.01) | |
| *F21V 23/04* | (2006.01) | |
| *H05K 1/02* | (2006.01) | |
| *G04G 9/00* | (2006.01) | |
| *G04G 17/04* | (2006.01) | |
| *H05K 1/18* | (2006.01) | |
| *F21Y 103/33* | (2016.01) | |

(52) U.S. Cl.
CPC .............. *G02B 6/002* (2013.01); *G02B 6/009* (2013.01); *G02B 6/0031* (2013.01); *G02B 6/0068* (2013.01); *G02B 6/0073* (2013.01); *G02B 6/0081* (2013.01); *G02B 6/0083* (2013.01); *G02B 6/0088* (2013.01); *G02B 6/0093* (2013.01); *G04G 9/0005* (2013.01); *G04G 17/045* (2013.01); *H05K 1/028* (2013.01); *F21Y 2103/33* (2016.08); *G02F 1/133615* (2013.01); *G02F 2201/56* (2013.01); *H05K 1/181* (2013.01); *H05K 2201/0133* (2013.01); *H05K 2201/09027* (2013.01); *H05K 2201/10106* (2013.01)

(56) References Cited

U.S. PATENT DOCUMENTS

| | | | |
|---|---|---|---|
| 2012/0106198 A1* | 5/2012 | Lin | G02B 6/0083 362/609 |
| 2012/0243253 A1 | 9/2012 | Claprood et al. | |
| 2016/0113106 A1* | 4/2016 | Kim | H05K 1/028 361/749 |

FOREIGN PATENT DOCUMENTS

| | | |
|---|---|---|
| JP | 2006-100271 A | 4/2006 |
| JP | 2009-199971 A | 9/2009 |
| JP | 2012-094514 A | 5/2012 |
| JP | 2013-180124 A | 9/2013 |

* cited by examiner

LIGHTING DEVICE AND DISPLAY DEVICE

TECHNICAL FIELD

The present invention relates to a lighting device and a display device.

BACKGROUND ART

Conventionally, liquid crystal display devices are used as a display device for small-sized, thin devices, such as notebook computers, portable telephone devices, and portable TVs. Liquid crystal display devices are also increasingly used as a display device in vehicle instruments for displaying vehicle information and traffic information. The liquid crystal display devices are provided with a lighting device for lighting a liquid crystal panel. The lighting device typically includes a light source, and a light guide plate which converts a light bundle from the light source into a planar light bundle optimized for lighting the liquid crystal panel. An example of this type of lighting device is disclosed in Patent Document 1 indicated below. Patent Document 1 discloses a lighting device provided with a light source and a light guide member. Light emitted by the light source enters a light entry portion of the light guide member and exits from a light exit portion of the light guide member to light a liquid crystal panel which is the member to be lighted. The light guide member has a substantially circular shape, and is provided with a plurality of light sources. The plurality of light sources are disposed on a peripheral edge of the light guide member such that the directions of light emitted from the light sources can all intersect each other.

PRIOR ART DOCUMENT

Patent Document

Patent Document 1: Japanese Unexamined Patent Publication No. 2009-199971

Problem to be Solved by the Invention

The substantially circular light guide member disclosed in Patent Document 1 is described as being subject to more or less variations in its radial dimension due to manufacturing error, and to thermal expansion or thermal contraction due to changes in temperature environment during use. Accordingly, it has been difficult to maintain a uniform positional relationship between the light guide plate and the plurality of light sources disposed so as to surround the light guide plate, possibly resulting in brightness variations.

DISCLOSURE OF THE PRESENT INVENTION

The present invention was made in view of the above circumstances, and an object of the present invention is to suppress brightness variations.

Means for Solving the Problem

A lighting device according to the present invention includes at least: a plurality of light sources arranged in an annular and curved shape; a light guide plate surrounded by the plurality of light sources and having an outer shape along an arrangement of the plurality of light sources, the light guide plate being configured to guide light from the plurality of light sources; and a light source board on which the plurality of light sources are mounted and a wiring portion configured to feed power to the plurality of light sources is formed, the light source board extending along the arrangement of the plurality of light sources and nave a terminated annular shape or am endless annular shape. The light source board includes a no-wiring formed region in a part thereof with respect to a circumferential direction, the wiring portion being not formed in the no-wiring formed region.

According to this configuration, the light emitted from the plurality of light sources arranged in an annular and curved shape is guided by the light guide plate surrounded by the plurality of light sources and having an outer shape along the arrangement of the plurality of light sources. The light source board extending along the arrangement of the plurality of light sources and having a terminated annular shape or an endless annular shape includes, in a part thereof, the no-wiring formed region where the wiring portion is not formed. Accordingly, even when the light source board is deformed so as to entirely contract or expand, the deformation can be absorbed or permitted by the no-wiring formed region, whereby the power feeding by the wiring portion to the light sources is not readily affected. Accordingly, for example, even when variations are caused in the dimension of the light guide plate due to manufacturing error and the like, or even when the light guide plate is thermally expanded or thermally contracted, the light source board can easily deform without affecting the power feeding to the light source. This is preferable from the viewpoint of maintaining a uniform positional relationship between the plurality of light sources and the light guide plate surrounded by the plurality of light sources. In this way, brightness variations are made difficult to occur in the light emitted from the lighting device.

Embodiments of the present invention may preferably include the following configurations.

(1) The light source board may have an endless annular shape, and include at least an expandable portion in the no-wiring formed region. In this way, for example, by setting the inner shape dimension of the light source board to be smaller than the outer shape dimension of the light guide plate, even when variations are caused in the dimension of the light guide plate or the light source board due to manufacturing error and the like, the expandable portion can expand during installation of the light source board and the light guide plate. Accordingly, the light source board can be deformed so as to easily expand, and the deformed shape of the light source board can be maintained by the light guide plate.

(2) The expandable portion may include a meandering portion having a plurality of slits in the light source board and extending with meandering in the circumferential direction. In this way, as a result of forming the plurality of slits in the light source board, when the meandering portion, which extends, while meandering, along the circumferential direction, is expanded along the circumferential direction, the light source board can be deformed so as to expand. Because the meandering portion serving as the expandable portion is configured by utilizing a part of the light source board, compared with if the expandable portion is made of a different material from that of the light source board, the manufacturing cost for the light source board cam be reduced. When the plurality of slits are formed in the light source board, cuts and the like may be more easily caused in the meandering portion due to expansion. However, because the meandering portion is not formed with the wiring portion, the influence on the power feeding to the light source can be avoided.

(3) The light source board may include a board body extending along the arrangement of the plurality of light sources and having a terminated annular shape, and an easily deformable portion connecting both ends of the board body and made of an easily deformable material compared with the board body. The expandable portion may include the easily deformable portion. Accordingly, the expandable portion includes the easily deformable portion provided so as to connect the both ends of the board body having the terminated annular shape, and is made of a material more easily deformable than the material of the board body. Accordingly, higher freedom of design concerning ease of expansion of the expandable portion can be achieved.

(4) The easily deformable portion may be made of an elastic material that is elastically expandable and contractible. In this way, when the light guide plate is thermally expanded due to a change in thermal environment and then thermally contracted, the easily deformable portion made of elastic material (expandable portion) is elastically contracted in accordance with the thermal contraction of the light guide plate. Accordingly, the light source board can be deformed so as to contract in conformity to the thermal contraction of the light guide plate.

(5) The light source board may have a terminated annular shape. The no-wiring formed region may be sandwiched between both ends of the light source board. In this way, the light source board having the terminated annular shape includes the no-wiring formed region between the both ends thereof. Accordingly, the light source board can be deformed so as to entirely contract or expand.

(6) The lighting device may further include functional components including an imaging element, a sensor, a switch, and a connector. The functional components may be housed in the no-wiring formed region sandwiched between the both ends of the light source board. In this way, the no-wiring formed region disposed so as to be sandwiched between the both ends of the light source board having the terminated annular shape can be effectively utilized as a space where the functional components are housed. In this way, compared with if the functional components are disposed outside or inside the light source board with respect to the radial direction, a narrower frame can be obtained.

(7) The light source board may include at least: a board body having a terminated annular shape or an endless annular shape that is along the arrangement of the plurality of light sources, the board body having the plurality of light sources and the wiring portion thereon; and an extended portion extending in a radial direction from a part of the board body with respect to the circumferential direction, the extended portion having the wiring portion. The board body may include the no-wiring formed region in a position directly opposite from the extended portion with respect to the circumferential direction. In this way, the plurality of light sources mounted on the board body are fed with power by the wiring portion provided in each of the board body and the extended portion along the radial direction, of the part of the board body with respect to the circumferential direction. The no-wiring formed region is disposed on the board body at the position directly opposite from the extended portion with respect to the circumferential direction. Accordingly, the creepage distances, from the no-wiring formed region to the extended portion, on the board body with respect to the circumferential direction become substantially the same. Accordingly, it becomes difficult for non-uniformity to be introduced into the amount of deformation when the board body is deformed. In this way, failure in the plurality of light sources mounted on the board body is made difficult to occur.

(8) The extended portion may extend from the board body outward in the radial direction. The board body may include a recess portion in a part of the board body with respect to the circumferential direction where the extended portion is led out, the recess portion being formed by recessing an inner edge portion of the part. When the board body is deformed, a large stress could develop in the part of the board body from which the extended portion is led out with respect to the circumferential direction. However, because the recess portion is formed so as to recess the inner edge portion of the part, the generated stress cam be absorbed. In this way, damage to the board body is made difficult to occur.

(9) The light source board may include a light guide plate contact portion disposed more inside than the light source with respect to the radial direction, the light guide plate contact portion to be in contact with the light guide plate. In this way, for example, by setting the inner shape dimension of the light source board to be smaller than the outer shape dimension of the light guide plate, even when variations are caused in the dimension of the light guide plate or the light source board due to manufacturing error and the like, the light source board can be deformed so as to expand as the light guide plate contact portion comes in contact with the light guide plate during installation of the light source board and the light guide plate. In this case, the light guide plate can be prevented from directly interfering with the light source, so that damage to the light source can be avoided.

(10) The light guide plate abutting portion may be disposed between the light sources adjacent to each other with respect to the circumferential direction. In this way, compared with if the light guide plate contact portion is disposed between the light source and the light guide plate with respect to the radial direction, the situation in which the entry of light from the light source into the light guide plate is interfered by the light guide plate contact portion is made difficult to occur. In addition, by the light guide plate contact portion, the situation in which each of the light sources adjacent to each other with respect to the circumferential direction interferes with the light guide plate can be preferably avoided.

(11) A plurality of the light guide plate contact portions may be disposed so as to sandwich one of the light sources with respect to the circumferential direction. In this way, compared with if the light guide plate contact portions are disposed so as to be adjacent to the light sources only on one side with respect to the circumferential direction, the reliability with which the light sources can be avoided from interfering with the light guide plate can be further increased.

(12) The light source board may include at least a board body having a terminated annular shape or an endless annular shape that is along the arrangement of the plurality of light sources, the board body having the plurality of light sources and the wiring portion, and an extended portion extending in a radial direction from, a part of the board body with respect to the circumferential direction, and having the wiring portion. The board body may include a first extending portion and a second extending port ion extending in the circumferential direction from a part where the extended portion is led out to the no-wiring formed region. The wiring portion may include a first wiring portion disposed on the first extending portion, and a second wiring portion disposed on the second extending portion. In this way, because the first wiring portion and the second wiring portion of the wiring portion are respectively provided in the first extending portion and the second extending portion of the board body, power cam be fed to each of the light sources mounted in the respective extending portions.

(13) The wiring portion may include a plurality of the first wiring portions and a plurality of the second wiring portions. In this way, for example, when the plurality of light sources mounted on the light source board are driven with a direct-current, the power feeding system for the light sources mounted on the respective extending portions can be divided into a plurality of systems. This is particularly preferable when the number of light sources mounted on the light source board is large.

In order to solve the problem, a display device according to the present invention includes the lighting device and a display panel configured to perform a display by utilizing light from the lighting device.

In the display device having the above configuration, brightness variations are not readily caused in the lighting device which supplies light to the display panel. Accordingly, a display with excellent display quality can be performed.

Advantageous Effect of the Invention

According to the present invention, brightness variations can be suppressed.

MODE FOR CARRYING OUT THE INVENTION

First Embodiment

Figure 1:
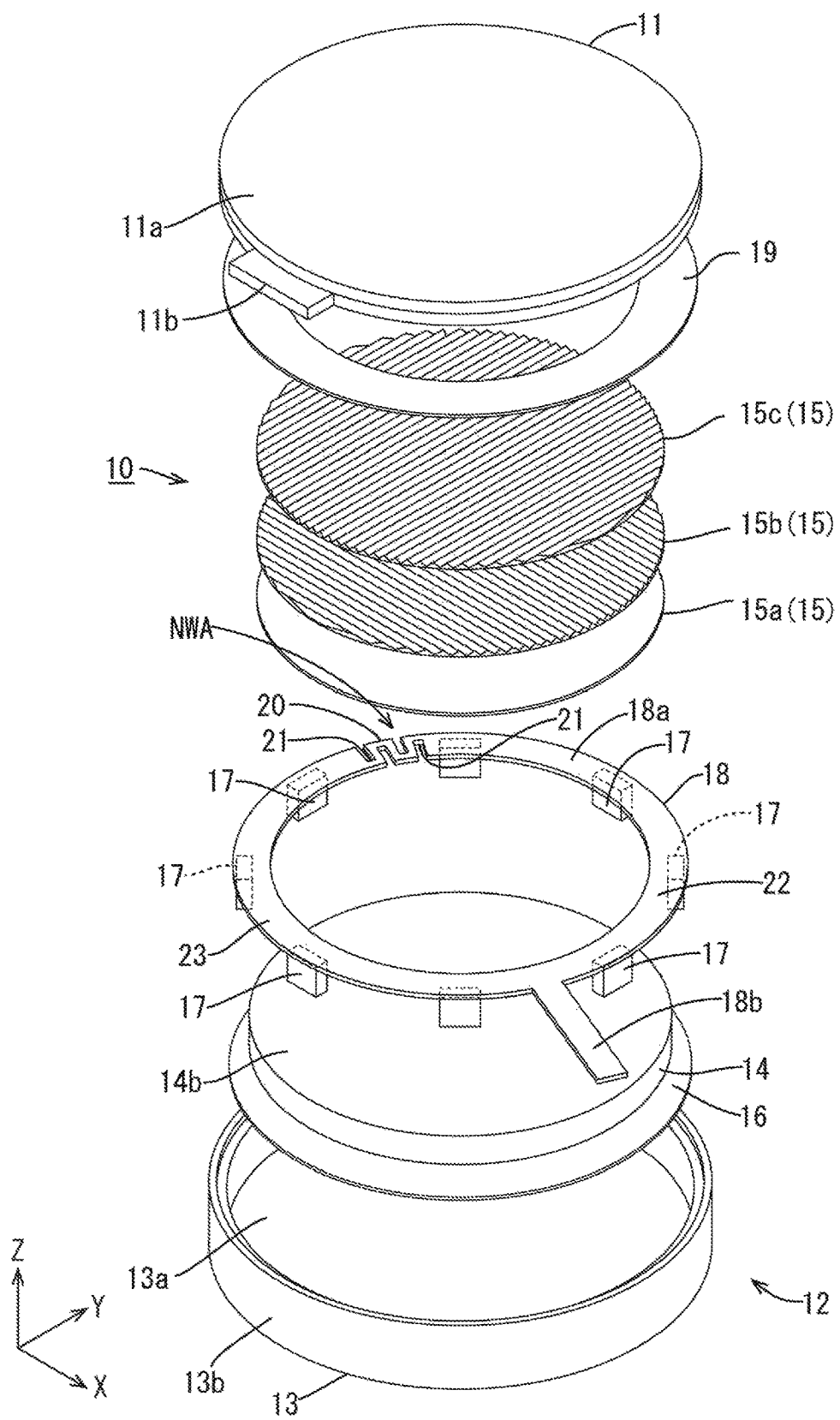
FIG. 1 is an exploded perspective view of a liquid crystal display device according to a first embodiment of the present invention.

A first embodiment of the present invention will be described with reference to FIG. 1 to FIG. 7. In the present embodiment, a liquid crystal display device (display device) 10 provided with a liquid crystal panel 11 as a display panel will be described by way of example. In some of the drawings, an X-axis, a Y-axis, and a Z-axis are shown, and the axial directions correspond to the directions illustrated in the drawings. Upper and lower directions are indicated with reference to FIG. 3 and FIG. 4, the top of the figures corresponding to an upper side and the bottom corresponding to a lower side.

The liquid crystal display device 10 as a whole has a substantially circular shape. As illustrated in FIG. 1, the liquid crystal display device 10 includes, at least, a liquid crystal panel (display panel) 11 configured to display an image, and a backlight device (lighting device) 12 which is disposed on the lower side with respect to the liquid crystal panel 11 and which supplies the liquid crystal panel 11 with light for the display. While not illustrated, it is also possible to adopt a configuration in which the liquid crystal display device 10 is provided with a bezel for holding the outer peripheral ends of the liquid crystal panel 11 with the backlight device 12. The liquid crystal display device 10 according to the present embodiment may preferably be used for various electronic devices (not illustrated) which include, but are not limited to: portable telephones (including smartphones and the like); notebook computers (including tablet notebook computers and the like); portable information terminals (including electronic books, PDAs and the like); digital photo frames; and portable game machines. Accordingly, for example, the liquid crystal panel 11 of the liquid crystal display device 10 preferably has a screen dimension which is on the order of, but not limited to, several inches to several tens of inches, which are generally classified as being small-sized or middle-sized.

Figure 3:
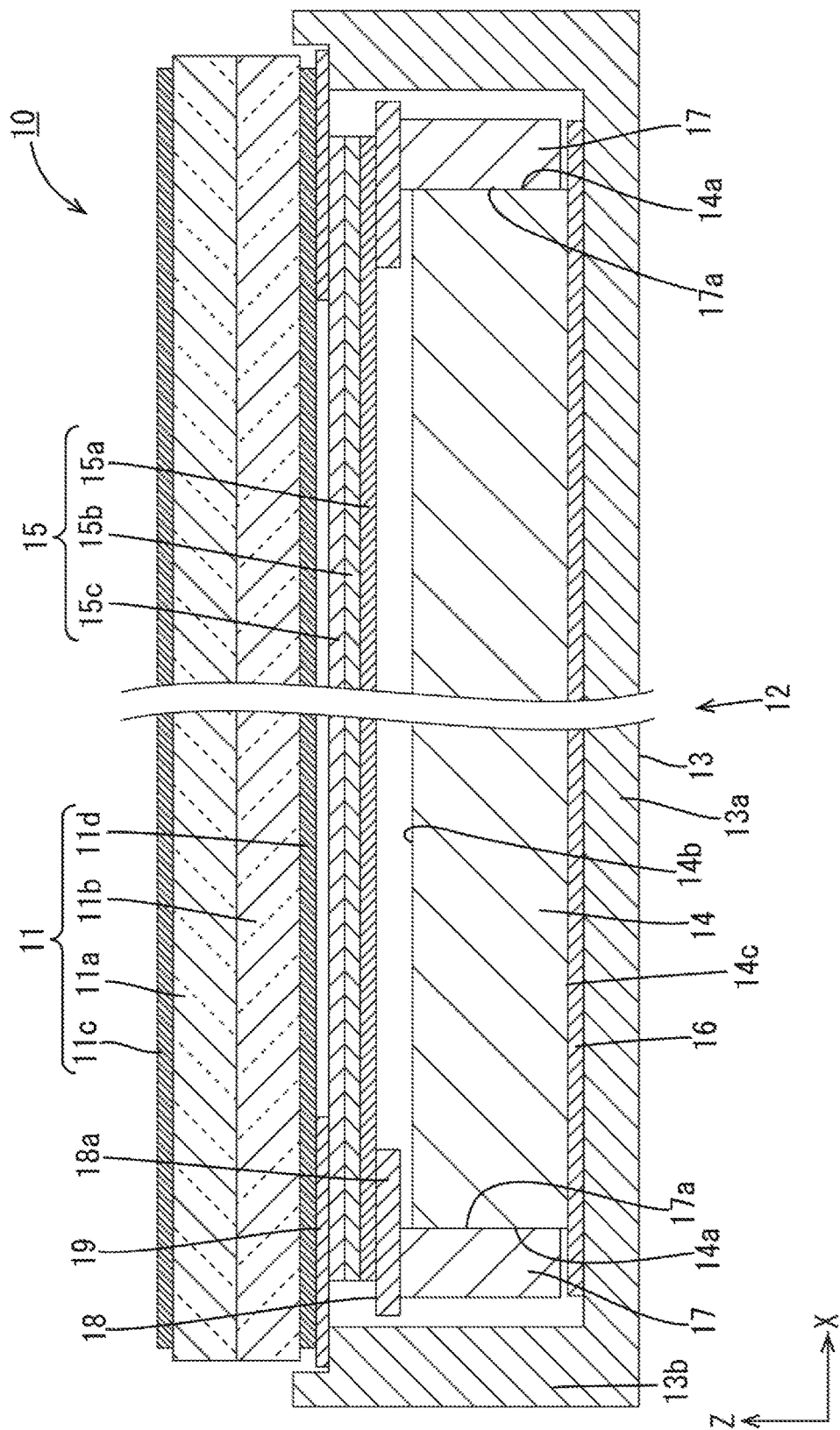
FIG. 3 is a cross sectional view taken along line iii-iii of FIG. 2.

The liquid crystal panel 11 will be described in detail. The liquid crystal panel 11, as illustrated in FIG. 1, has as a whole a substantially circular shape as viewed in plan. The liquid crystal panel 11, as illustrated in FIG. 3, is provided with a pair of glass substrates 11a, 11b which are substantially transparent and highly light transmissive, and a liquid crystal layer (not illustrated) which is interposed between the substrates 11a, 11b, the liquid crystal layer including liquid crystal molecules including material of which the optical characteristics can be changed by applying an electric field. The substrates 11a, 11b are bonded to each other, using a sealing agent not illustrated, with a gap corresponding to the thickness of the liquid crystal layer maintained therebetween. The liquid crystal panel 11 includes a substantially circular-shaped display region (active area) disposed at the center side of the screen to display an image, and a substantially ring-shaped (substantially circular frame-shaped or doughnut-shaped) non-display region (non-active area) which is disposed on the screen outer periphery so as to surround the display region and in which no image is displayed. The liquid crystal panel 11 is configured to display an image in the display region by utilizing light supplied from the backlight device 12. The liquid crystal panel 11 has a light output side on the upper side. To the outer sides of the substrates 11a, 11b, polarization plates 11c, 11d are respectively affixed.

One of the substrates 11a, 11b of the liquid crystal panel 11 which is on the upper side (front surface side) includes a CF substrate 11a, and the one on the lower side (back surface side) includes an array substrate 11b. The array substrate 11b includes a part protruding outward beyond the outer shape of the CF substrate 11a. The part is provided with a terminal portion (not shown) which is connected to a flexible substrate (not shown) for supplying various signals. On an inner surface side (liquid crystal-layer side; the surface side opposing the CF substrate 11a) of the array substrate 11b, a number of thin-film transistor (TFT) as switching elements and pixel electrodes are arranged in a matrix (in rows and columns). The TFTs and the pixel electrodes are surrounded by gate wiring and source wiring disposed in a grid. The gate wiring and the source wiring are configured to be respectively supplied with image signals by a driver (not illustrated). The pixel electrodes disposed in a rectangular region surrounded by the gate wiring and source wiring include transparent electrodes of indium tin oxide (ITO) or zinc oxide (ZnO), for example. On the other hand, on the inner surface side of the CF substrate 11a, a number of color filters are arranged in a matrix at positions corresponding to the respective pixels. The color filters are arranged such that the three colors of R, G, and B are alternated. Between the color filters, a light shield layer (black matrix) for preventing color mixing is formed. On the surfaces of the color filters and the light shield layer, counter electrodes are provided so as to oppose the pixel electrodes on the array substrate 11b side. On the inner surface sides of the substrates 11a, 11b, alignment films (not illustrated) for positioning the liquid crystal molecules included in the liquid crystal layer are respectively formed.

Figure 2:
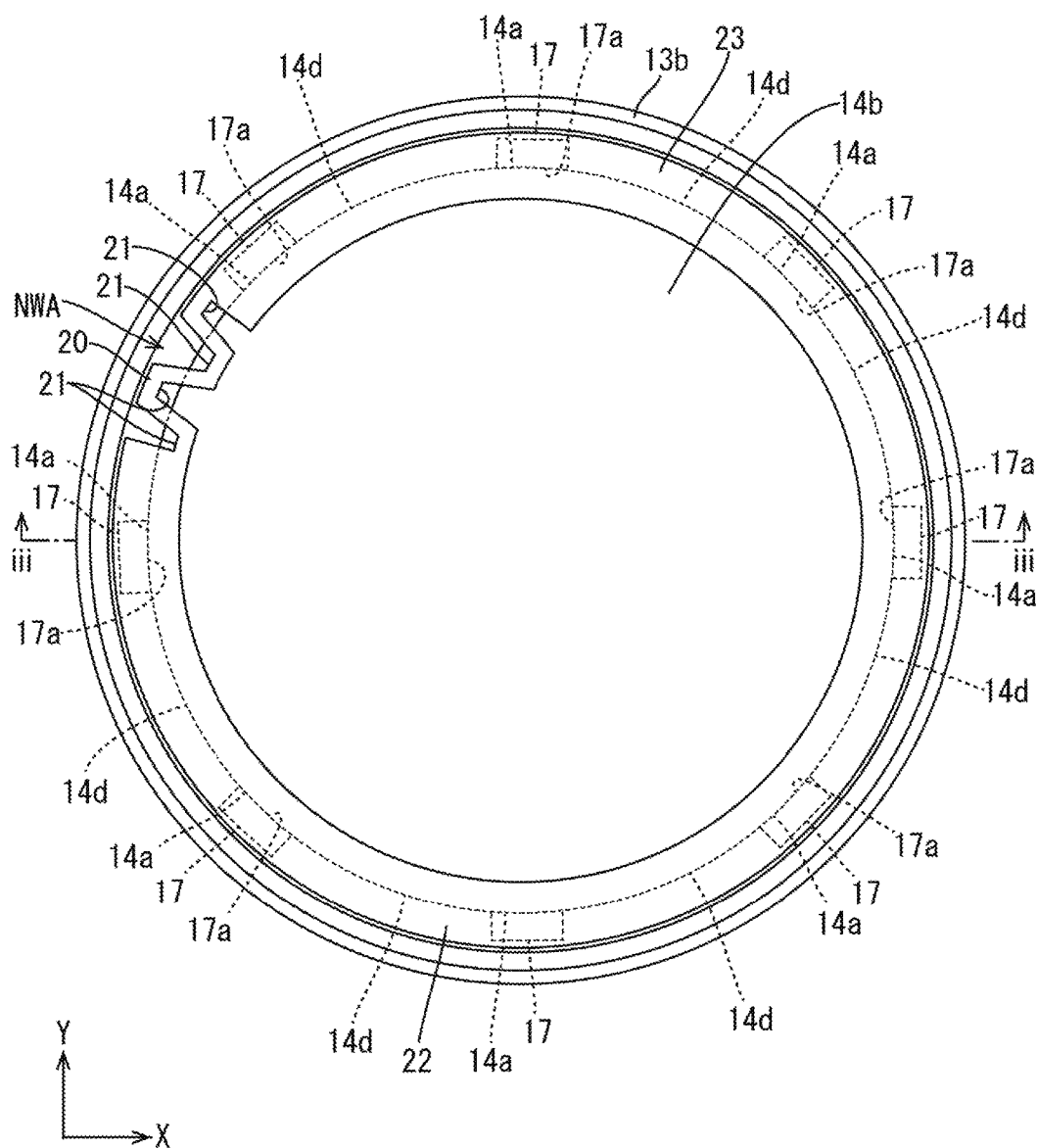
FIG. 2 is a plan view of a backlight device provided in the liquid crystal display device.

The configuration of the backlight device 12 will be described in detail. The backlight device 12 as a whole is substantially circular and substantially block-shaped as viewed in plan, similarly to the liquid crystal panel 11. The backlight device 12, as illustrated in FIG. 1 to FIG. 3, is provided with at least: a substantially box-shaped chassis (housing) 13 having an opening toward the liquid crystal panel 11; a plurality of light emitting diodes (LEDs) 17 as light sources; an LED board (light source board) 18 on which the plurality of LEDs 17 are mounted; a light guide plate 14 which is superposed on the upper side with respect to the chassis 13 and which guides light from the LEDs 17; a plurality of optical sheets 15 which are superposed on the upper side (light output side) with respect to the light guide plate 14, and which provides the light output from the light guide plate 14 with an optical effect for exit toward the liquid crystal panel 11; and a reflection sheet 16 which is sandwiched between the chassis 13 and the light guide plate 14 and which reflects light toward the light guide plate 14. The backlight device 12 converts the light from the LEDs 17 into planar light using the optical effects of the light guide plate 14, the optical sheets 15, and the reflection sheet 16, and outputs the light from the opening portion of the chassis 13 toward the liquid crystal panel 11 on the upper side. That is, the upper side with respect to the backlight device 12 corresponds to the light output side. In the following, the constituent components of the backlight device 12 will be described in order. The Z-axis direction indicated in the drawings corresponds to the direction normal to the sheet face of the light guide plate 14, the optical sheets 15, and the reflection sheet 16, and corresponds to the direction in which the chassis 13, the light guide plate 14, the optical sheets 15, and the reflection sheet 16 are superposed on each other.

The chassis 13 is made from synthetic resin material or metal material. As illustrated in FIG. 1 to FIG. 3, the chassis 13 has a planar shape which is substantially circular, and is substantially box-shaped (a substantially cylindrical shape with a bottom) with an opening toward the upper side. The chassis 13 accommodates the LED board 18, the light guide plate 14, the optical sheets 15, and the reflection sheet 16. The chassis 13 as a whole has a substantially circular shape as viewed in plan (as viewed from the Z-axis direction), similarly to the liquid crystal panel 11 and the like. The chassis 13 includes a substantially circular bottom wall portion 13a, and a side wall portion 13b rising from the outer peripheral end of the bottom wall portion 13a toward the upper side. The bottom wall portion 13a has a sheet face which is parallel with the sheet face of each of the light guide plate 14, the optical sheets 15, the reflection sheet 16, and the liquid crystal panel 11, and supports, from the lower side, the light guide plate 14, the optical sheets 15, and the reflection sheet 16 accommodated in the chassis 13. The side wall portion 13b is disposed so as to surround, from the outer peripheral side, the light guide plate 14, the optical sheets 15, the reflection sheet 16, and the LED board 18 (LEDs 17) accommodated in the chassis 13. Accordingly, the side wall portion 13b as a whole is substantially ring-shaped (substantially circular frame-shaped). To a distal end of the side wall portion 13b, a lower side face at the outer peripheral end of a panel fixing tape 19 for fixing the liquid crystal panel 11 to the backlight device 12 is fixedly attached. The panel fixing tape 19 is a double-sided tape including adhesive faces on both sides of a base member. The panel fixing tape 19 is fixedly attached to the side wall portion 13b and the optical sheets 15 which will be described later (specifically, a second lens sheet 15c which will be described later) so as to span therebetween, and also to the liquid crystal panel 11.

The LEDs 17, as illustrated in FIG. 1 to FIG. 3, are constructed of LED chips (LED elements), which are semiconductor light-emitting elements, that are encapsulated with resin material on a substrate portion fixedly attached to the sheet face of the LED board 18. The LEDs 17 have anode and cathode terminals, not illustrated, between which a forward-bias DC current is flowed to cause the LED chips to emit light. The LED chips mounted on the substrate portion have a single main emission wavelength, specifically for the single color of blue. The resin material in which the LED chips are encapsulated has dispersed and compounded therein fluorescent materials which, when excited by the blue light from the LED chips, emit predetermined colors of light (for example yellow, green, and red), so that the LEDs 17 as a whole emit generally white light. The LEDs 17 are of a so-called side-emitting type, with light-emitting faces 17a arranged on a side surface adjacent to the mounting face on the LED board 18. The LEDs 17 have a height dimension smaller than a thickness dimension of the light guide plate 14, which will be described later, and specifically may be approximately 0.4 mm, for example. The LEDs 17 have an optical axis in parallel to a direction normal to the light-emitting faces 17a. The "optical axis" herein refers to the direction of propagation of light having the highest emission strength, in the emitted light (light distribution) from the LEDs.

Figure 4:
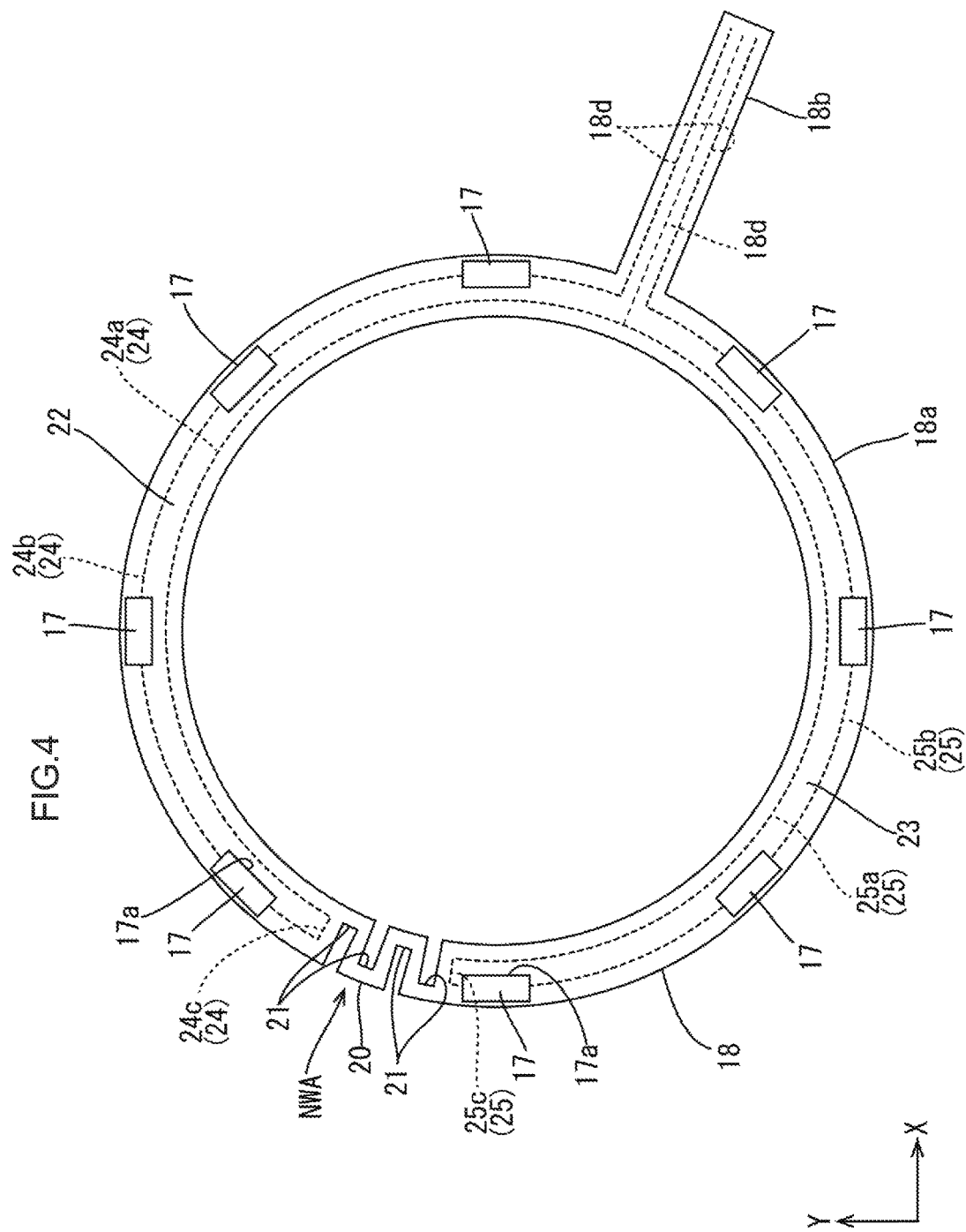
FIG. 4 is a bottom view of am LED board.

The LED board 18, as illustrated in FIG. 1, FIG. 3, and FIG. 4, is made of a flexible insulating material (such as polyimide), and has a film shape (sheet shape), with a sheet face in parallel with a sheet face of the bottom wall portion 13a of the chassis 13, for example. The LED board 18 is made of a material that has excellent heat resistance and a thermal expansion rate lower than the thermal expansion rate of the light guide plate 14. The LED board 18 includes: a board body 18a having an endless ring-shape extending along the circumferential direction of the light guide plate 14, the optical sheets 15, and the reflection sheet 16; and a extended portion 18b extending in a radial direction from a part of the board body 18a. The endless ring-shaped board body 18a has an inner diameter dimension which is smaller than outer diameter dimensions of the light guide plate 14 and the reflection sheet 16, and an outer diameter dimension which is approximately equivalent to an outer diameter dimension of the light guide plate 14 and the reflection sheet 16. The endless ring-shaped board body 18a is disposed so as to overlap the outer peripheral end of the light guide plate 14 on the upper side. The board body 18a is fixedly attached to the optical sheets 15 (specifically, a diffuser sheet 15a which will be described later) that overlaps the board body 18a on the upper side thereof, via fixing material which is not illustrated. Examples of the fixing material include a double-sided tape and an adhesive. The board body 18a is patterned with wiring portions 18c for feeding power to the mounted LEDs 17. The specific pattern of the wiring portions 18c will be described in detail later. The "radial direction" herein refers to a direction in which the distance from the center of a circular or annular object (such as the light guide plate 14 and the LED board 18) varies, whereas the "circumferential direction" refers to a direction in which the distance from the center does not change.

Figure 5:
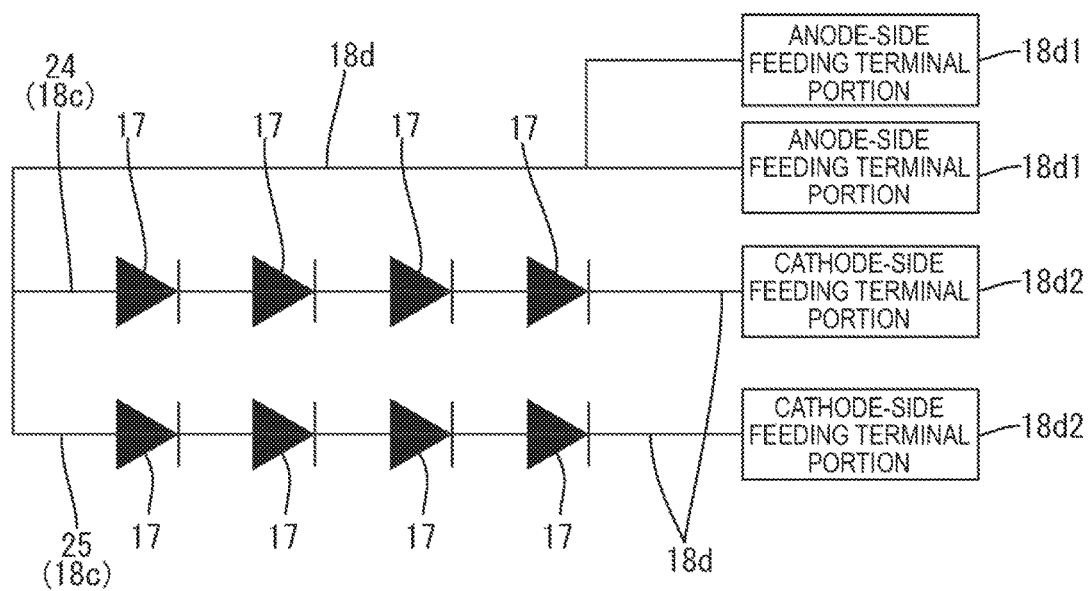
FIG. 5 is a circuit diagram illustrating a circuit configuration of the LED board.

Of the upper and lower sheet faces of the board body 18a of the LED board 18, the lower side sheet face has a plurality of LEDs 17 mounted thereon, as illustrated in FIG. 3 and FIG. 4. The terminals of the LEDs 17 are soldered for mechanical and electrical connections. The plurality of LEDs 17 are arranged in a ring shape (ring-shaped and curved) on the board body 18a along the circumferential direction of the board body 18a, at intervals with respect to the circumferential direction. Specifically, the LEDs 17 are arranged at regular angular intervals on the board body 18a. More specifically, eight LEDs 17 are disposed side by side at positions spaced apart by angular intervals of approximately 45 degrees with respect to the circumferential direction of the board body 18a. Accordingly, the LEDs 17 are arranged symmetrically with respect to the central point of the board body 18a, with the light emitting faces 17a arranged at angular intervals of 180 degrees opposing each other via the light guide plate 14. The LEDs 17 have their light emitting faces 17a all directed toward the center of the light guide plate 14. The interval between the LEDs 17 that are adjacent to each other with respect to the circumferential direction of the board body 18a is greater than the width dimension of the LEDs 17. The extended portion 18b is continuous with a portion of the board body 18a which is between predetermined LEDs 17 that are adjacent to each other with respect to the circumferential direction of the board body 18a. From the continuous portion, the extended portion 18b extends outward substantially straight along the radial direction. The extended portion 18b is provided with extended wiring portions 18d continuous with the wiring portions 18c of the board body 18a. The extended wiring portions 18d is provided so as to extend linearly along the direction in which the extended portion 18b extends, with exposed terminal portions 18d1, 18d2 provided at the tip-end. The terminal portions 18d1, 18d2, as illustrated in FIG. 5, respectively include two anode-side feeding terminal portions 18d1 and two cathode-side feeding terminal portions 18d2. The extended wiring portions 18d include one which is commonly continuous with the two anode-side feeding terminal portions 18d1, and two which are individually continuous with the two cathode-side feeding terminal portions 18d2. The extended portion 18b is led out of the backlight device 12 via an opening portion (not shown) partly formed in the bottom wall portion 13a of the chassis 13 (see FIG. 3). The extended portion 18b led through the opening portion is configured such that the terminal portion is connected to a feeding connector of an LED drive circuit substrate, not shown, which is arranged on the back of the chassis 13.

The light guide plate 14, as illustrated in FIG. 1 to FIG. 3, is made of synthetic resin (for example, acrylic resin, such as PMMA), and has a substantially circular shape as viewed in plan, similarly to the bottom wall portion 13a of the chassis 13. The light guide plate 14 has an outer diameter dimension which is slightly smaller than the bottom wall portion 13a of the chassis 13. That is, the light guide plate 14 may be said to have an outer shape conforming to the ring-shaped arrangement of the LEDs 17 on the LED board 18. The light guide plate 14 has a thermal expansion rate higher than that of the LED board 18, and therefore has a relatively large amount of expansion or contraction associated with thermal expansion or thermal contraction. The light guide plate 14 is accommodated in the chassis 13 so as to be surrounded by the side wall portion 13b, and is disposed directly below the liquid crystal panel 11 and the optical sheets 15. The light guide plate 14 has an outer peripheral end face which is sectioned into LED opposing portions (light source opposing portions) opposing the LEDs 17, and LED non-opposing portions (light source non-opposing portions) not opposing the LEDs 17. The LED opposing portions constitute light input faces 14a via which the light from the LEDs 17 directly enters. On the other hand, the LED non-opposing portions constitute non-light entry faces 14d via which hardly any of the light from, the LEDs 17 directly enters. On the outer peripheral end face of the light guide plate 14, the light entry faces 14a and the non-light entry faces 14d are repeatedly arranged, alternately with respect to the circumferential direction. The light entry faces 14a and the non-light entry faces 14d are arranged, at regular angular intervals of approximately 45 degrees. The areas with respect to the circumferential direction in which the light entry faces 14a are formed on the outer peripheral end face of the light guide plate 14 are generally equal to the width dimension of the LEDs 17, and are narrower than the corresponding areas in which the non-light entry faces 14d are formed. The light guide plate 14 has a thickness dimension which is greater than the above-described height dimension of the LEDs 17. Specifically, the thickness dimension of the light guide plate 14 is, for example, on the order of 0.6 mm. In the present embodiment, while the LED non-opposing portions are described as "the non-light entry faces 14d", this does not mean that there is no incident light at all. Light that has leaked outward from the non-light entry faces 14a may be reflected and returned by the side wall portion 13b, and the return light may become incident on the non-light entry faces 14d, for example.

Of the upper and lower pair of sheet faces of the light guide plate 14, the sheet face facing the upper side (liquid crystal panel 11 side), as illustrated in FIG. 3, is a light emitting face 14b via which light is emitted toward the liquid crystal panel 11. On the other hand, the sheet face of the light guide plate 14 facing the lower side (reflection sheet 16 side; bottom, wall portion 13a side) is an opposite sheet face (reflection, sheet-side sheet face) 14c on the opposite side from the light emitting face 14b. In this configuration, the direction in which the LEDs 17 and the light, guide plate 14 are arranged and the direction in which the optical sheets 15 (liquid crystal panel 11) and the light guide plate 14 are arranged are orthogonal to each other. The light guide plate 14 has the function of introducing the light emitted from the LEDs 17 via the light input faces 14a, and causing the light to propagate therein and rise upward toward the optical sheets 15 (upper side; light emitting side) so as to exit via the light emitting face 14b, i.e., the upper side sheet face. On the opposite sheet face 14c of the light guide plate 14, a light reflecting pattern (not illustrated) is formed which includes a light reflecting portion for promoting the emission via the light emitting face 14b by reflecting the light in the light guide plate 14 toward the light emitting face 14b. The light reflecting portion of the light reflecting pattern includes a number of light reflecting dots having a distribution density varying in accordance with the distance from the light input faces 14a (LEDs 17). Specifically, with respect to the radial direction of the light guide plate 14, the distribution density of the light reflecting dots of the light reflecting portion is inclined to become higher with increasing distance from the light input faces 14a and lower with decreasing distance to the light input faces 14a, so that the distribution density is the highest at the center position of the light guide plate 14 and the lowest at the outer peripheral end position of the light guide plate 14. With respect to the circumferential direction of the light guide plate 14, the distribution density of the light reflecting dots becomes the highest at the center position of the non-light entry faces 14d of the light guide plate 14 (at the intermediate position of the adjacent light input faces 14a), and the lowest at the center position of the light input faces 14a (the intermediate position of the adjacent non-light entry faces 14d normal to the light-emitting faces 17a of the LEDs 17). In this way, the optical design of the light reflecting pattern is optimized, whereby the brightness uniformity of the light emitted from the light emitting face 14b of the light guide plate 14 is improved.

The optical sheets 15, as illustrated in FIG. 1 and FIG. 3, have a substantially circular shape as viewed in plan, similarly to the light guide plate 14, and have an outer diameter dimension slightly greater than the light guide plate 14. The optical sheets 15 are placed on the upper side of the light emitting face 14b of the light guide plate 14, and interposed between the liquid crystal panel 11 and the light guide plate 14. The optical sheets 15 transmit the light output from the light guide plate 14, and allow the transmitted light to exit toward the liquid crystal panel 11 while providing the transmitted light with a predetermined optical effect. The optical sheets 15 according to the present embodiment includes a total of three sheets including one diffuser sheet 15a and two lens sheets 15b, 15c (the first lens sheet 15b and the second lens sheet 15c). The diffuser sheet 15a is configured of a substantially transparent synthetic resin base member in which a number of diffusing particles for diffusing light are dispersed and compounded. The diffuser sheet 15a is laid directly over the light guide plate 14, and is disposed nearest the light guide plate 14 among the optical sheets 15.

The two lens sheets 15b, 15c, as illustrated in FIG. 1 and FIG. 3, include a number of unit lenses provided on one sheet face of the substantially transparent synthetic resin base member. Of the two lens sheets 15b, 15c, the one superposed directly over the diffuser sheet 15a is the first lens sheet 15b, and the one which is superposed directly thereover and disposed closest to the liquid crystal panel 11 is the second lens sheet 15c. In the first lens sheet 15b, a number of unit lenses extending along a first direction in parallel with the sheet face are arranged side by side along a second direction perpendicular to the first direction, in order to provide the emitted light with a light condensing effect (anisotropic light condensing effect) selectively with respect to the second direction, in which the unit lenses are arranged. In the second lens sheet 15c, a number of the unit lenses extending along the second direction in parallel with the sheet face are arranged side by side along the first direction perpendicular to the second direction, in order to provide the emitted light with a light condensing effect selectively with respect to the first direction, in which the unit lenses are arranged. In this way, the first lens sheet 15b and the second lens sheet 15c have the respective unit lenses extending and arranged in mutually perpendicular directions. To the outer peripheral end of the second lens sheet 15c, the lower side face of the panel fixing tape 19 is fixedly attached. In drawings, the X-axis direction corresponds to the extending direction of the unit lenses of the first lens sheet 15b (first direction), and the Y-axis direction corresponds to the extending direction of the unit lenses of the second lens sheet 15c (second direction). In particular, in FIG. 1, the respective unit lenses of the lens sheets 15b, 15c are indicated by the stripes in parallel with the X-axis direction or the Y-axis direction.

The reflection sheet 16, as illustrated in FIG. 1 and FIG. 3, is disposed on the lower side of the light guide plate 14 so as to cover the opposite sheet face 14c on the opposite side from the light emitting face 14b. The reflection sheet 16 includes a synthetic resin sheet material with a highly optically reflective white surface. Accordingly, the reflection sheet 16 can cause the light that has propagated in the light guide plate 14 and exited via the opposite sheet face 14c to rise toward the upper side (light emitting face 14b) efficiently. The reflection sheet 16 has a substantially circular shape as viewed in plan, similarly to the light guide plate 14 and the optical sheets 15, and has an outer diameter dimension greater than the light guide plate 14. The reflection sheet 16 is disposed with its major portion toward the center sandwiched between the light guide plate 14 and the bottom wall portion 13a of the chassis 13. The outer peripheral end of the reflection sheet 16 extends outward beyond the outer peripheral end face of the light guide plate 14 so that, particularly by the portion extending from the light input faces 14a on the LEDs 17 side, the light from the LEDs 17 can be efficiently reflected and caused to enter the light input faces 14a.

As described above, because the light guide plate 14 has a substantially circular outer shape, the outer diameter dimension (dimension concerning the outer shape) may vary more or less due to manufacturing error. In addition, the light guide plate 14 may be subject to thermal expansion or thermal contraction due to changes in temperature environment during the use of the liquid crystal display device 10. Accordingly, it is difficult to maintain a uniform positional relationship between the light guide plate 14 and the plurality of LEDs 17 disposed so as to surround the light guide plate 14. For example, when a certain light entry face 14a and LED 17 are in a relatively close positional relationship, the light entry face 14a and LED 17 at the position with the angular interval of 180 degrees will have a relatively far positional relationship. In this case, the former will have an increased amount of incident light, producing a bright part. On the other hand, the latter will have a decreased amount of incident light, producing a dark part. As a result, brightness variations could be introduced into the light emitted from the light guide plate 14.

Accordingly, in the LED board 18 according to the present embodiment, as illustrated in FIG. 4, the wiring portions 18c are not formed in the entire area of the endless annular board body 18a. The LED board 18 includes, in a part of the LED board 18 with respect to the circumferential direction, a no-wiring formed region NWA where the wiring portions 18c are not formed. In this configuration, even if the LED board 18 is deformed so as to entirely contract or expand, the deformation of the LED board 18 can be absorbed or permitted by the no-wiring formed region NWA. Accordingly, when the LED board 18 is deformed, the power feeding to the LEDs 17 by the wiring portions 18c is not readily affected. Thus, even when there are variations in the size of the light guide plate 14 due to manufacturing error and the like, and as a result, thermal expansion or thermal contraction is caused in the light guide plate 14, the LED board 18 can easy deform without affecting the power feeding to the LEDs 17. This is preferable from the viewpoint of maintaining a uniform positional relationship between the plurality of LEDs 17 and the light guide plate 14 surrounded by the plurality of LEDs 17. In this way, the introduction of brightness variations in the light emitted from the backlight device 12 is made difficult to occur.

Specifically, the no-wiring formed region NWA of the endless annular LED board 18, as illustrated in FIG. 4, is provided with a meandering portion 20 which extends, while meandering, along the circumferential direction of the LED board 18. The meandering portion 20 is formed by providing the board body 18a with a plurality of slits 21. The meandering portion 20 has a configuration in which a portion extending outward along the radial direction of the board body 18a, a portion extending along the circumferential direction, a portion extending inward along the radial direction, and a portion extending along the circumferential direction are successively connected (a unit meandering portion), and a plurality of the connections are repeatedly connected. The slits 21 are formed so as to extend along the radial direction of the board body 18a and be open on outside or inside the board body 18a, while leaving an inner edge portion or an outer edge portion of the board body 18a. The slits 21 have a constant width. The slits 21 which are open on the inside with respect to the radial direction of the board body 18a, and the slits 21 which are similarly open on the outside, are disposed alternately side by side along the circumferential direction of the board body 18a, whereby the meandering portion 20 of the above-described configuration is formed. The meandering portion 20 is adapted to be expandable by being deformed such that the width of the slits 21 becomes wider. Accordingly, the meandering portion 20 may be said to constitute an "expandable portion" which can be expanded. Further, the meandering portion 20 is adapted to be contractible by being deformed such that the width of the slits 21 becomes narrower. Accordingly, the meandering portion 20 may also be referred to as an "expandable/contractible portion" that can be expanded and contracted (expansion and contraction). When the meandering portion 20 is in an expanded state due to an external force, the meandering portion 20 can elastically recover by removing the external force.

The meandering portion 20 is provided in the no-wiring formed region NWA of the LED board 18. Accordingly, by designing the size of the inner shape of the circle formed by the light emitting faces 17a of the plurality of LEDs 17 to be smaller than the size of the outer shape of the light guide plate 14, for example, even when variations are caused in the size of the light guide plate 14 or the LED board 18 due to manufacturing error and the like, the meandering portion 20 can expand during installation of the LED board 18 and the light guide plate 14. Accordingly, the LED board 18 can be deformed so as to easily expand, and the shape of the LED board 18 deformed so as to expand can be maintained by the light guide plate 14. In this way, a uniform positional relationship can be maintained between the plurality of LEDs 17 and the light guide plate 14 surrounded by the plurality of LEDs 17. In addition, the meandering portion 20 is provided by utilizing a part of the board body 18a as is. Accordingly, compared with if an expandable portion is made of a different material from that of the board body 18a, the manufacturing cost of the LED board 18 can be decreased. When the board body 18a has the slits 21, cuts and the like may be more readily caused in the meandering portion 20 during expansion. However, because the meandering portion 20 is provided in the no-wiring formed region NWA where the wiring portions 18c are not formed, the situation where power feeding to the LEDs 17 fails in the event of a cut in the meandering portion 20 can be avoided.

Further, the meandering portion 20 (no-wiring formed region NWA), as illustrated in FIG. 4, is disposed on the board body 18a of the LED board 18, at the position directly opposite from the extended portion 18b with respect to the circumferential direction of the board body 18a. That is, the meandering portion 20 and the extended portion 18b are respectively disposed at the positions on the endless annular board body 18a spaced apart by the angular interval of approximately 180 degrees. In this way, the creepage distances, from, the extended portion 18b to the meandering portion 20, on the board body 18a with respect to the circumferential direction become substantially the same. More specifically, when the board body 18a includes a first extending portion 22 and a second extending portion 23 which extend, along the circumferential direction of the board body 18a, to the meandering portion 20 from the portion where the extended portion 18b is led out, the first extending portion 22 and the second extending portion 23 have a semi-ringed shape and substantially equal length dimensions. Accordingly, non-uniformity is not readily caused in the amount of deformation of the first extending portion 22 and the second extending portion 23 when the board body 18a is deformed. If non-uniformity is caused in the amount of deformation of the extending portions, a large stress may act on the terminals (soldered portions) of the mounted LEDs 17 on the side with a relatively large amount of deformation, for example, which may lead to a mounting failure of the LEDs 17. In this respect, as described above, non-uniformity is not readily caused in the amount of deformation of the first extending portion 22 and the second extending portion 23. Accordingly, mounting failure is made difficult to occur in the LEDs 17 mounted on the extending portions 22, 23.

In addition, the wiring portions 18c, as illustrated in FIG. 4 and FIG. 5, include a first wiring portion 24 provided in the first extending portion 22, and a second wiring portion 25 provided in the second extending portion 23, of the board body 18a of the LED board 18. That is, the LED board 18 has two power feeding systems. The first wiring portion 24 and the second wiring portion 25 respectively extend along the first extending portion 22 and the second extending portion 23, and are routed and formed such that the portions on the meandering portion 20 (no-wiring formed region NWA) side are folded, with both ends thereof respectively connected to the extended wiring portions 18d of the extended portion 18*b*. Specifically, the first wiring portion 24 and the second wiring portion 25 have one ends commonly connected to the one of the extended wiring portions 18*d* which is continuous with the anode-side feeding terminal portions 18*d*1, whereas the other ends are respectively individually connected to those of the extended wiring portions 18*d* that are continuous with the cathode-side feeding terminal portions 18*d*2. The first wiring portion 24 and the second wiring portion 25 include portions 24*a*, 25*a* extending from the one ends toward the meandering portion 20 along the circumferential direction of the board body 18*a*; portions 24*b*, 25*b* extending from the other ends toward the meandering portion 20 along the circumferential direction of the board body 18*a*; and folded portions 24*c*, 25*c* connecting the above. The portions 24*b*, 25*b* continuous with the other ends traverse the LEDs 17 and are connected to the respective terminals thereof. The LED board 18 has the circuit configuration described above, so that the LEDs 17 provided in the first extending portion 22 and the second extending portion 23 are respectively driven with a direct-current.

A manufacturing procedure for the liquid crystal display device 10 according to the present embodiment, which has the structure described above, will be described. The liquid crystal display device 10 is manufactured after the liquid crystal panel 11 is manufactured in advance and the constituent components of the backlight device 12 are manufactured. Of the constituent components of the backlight device 12, with respect to the manufacture of the light guide plate 14 and the LED board 18 in particular, it is preferable to adopt design values such that, when the outer diameter dimension of the light guide plate 14 and the distance between the light emitting faces 17*a* of a pair of LEDs 17 opposing each other on the LED board 18 (spaced apart by the angular interval of 180 degrees) are compared, the former is greater than the latter. In this way, during the manufacture of the light guide plate 14 and the LED board 18, even if variations are caused in their finished dimensions due to manufacturing error and the like, it becomes possible to prevent the case where the distance between the light emitting faces 17*a* of the pair of LEDs 17 opposing each other on the LED board 18 becomes greater than the outer diameter dimension of the light guide plate 14.

Figure 6:
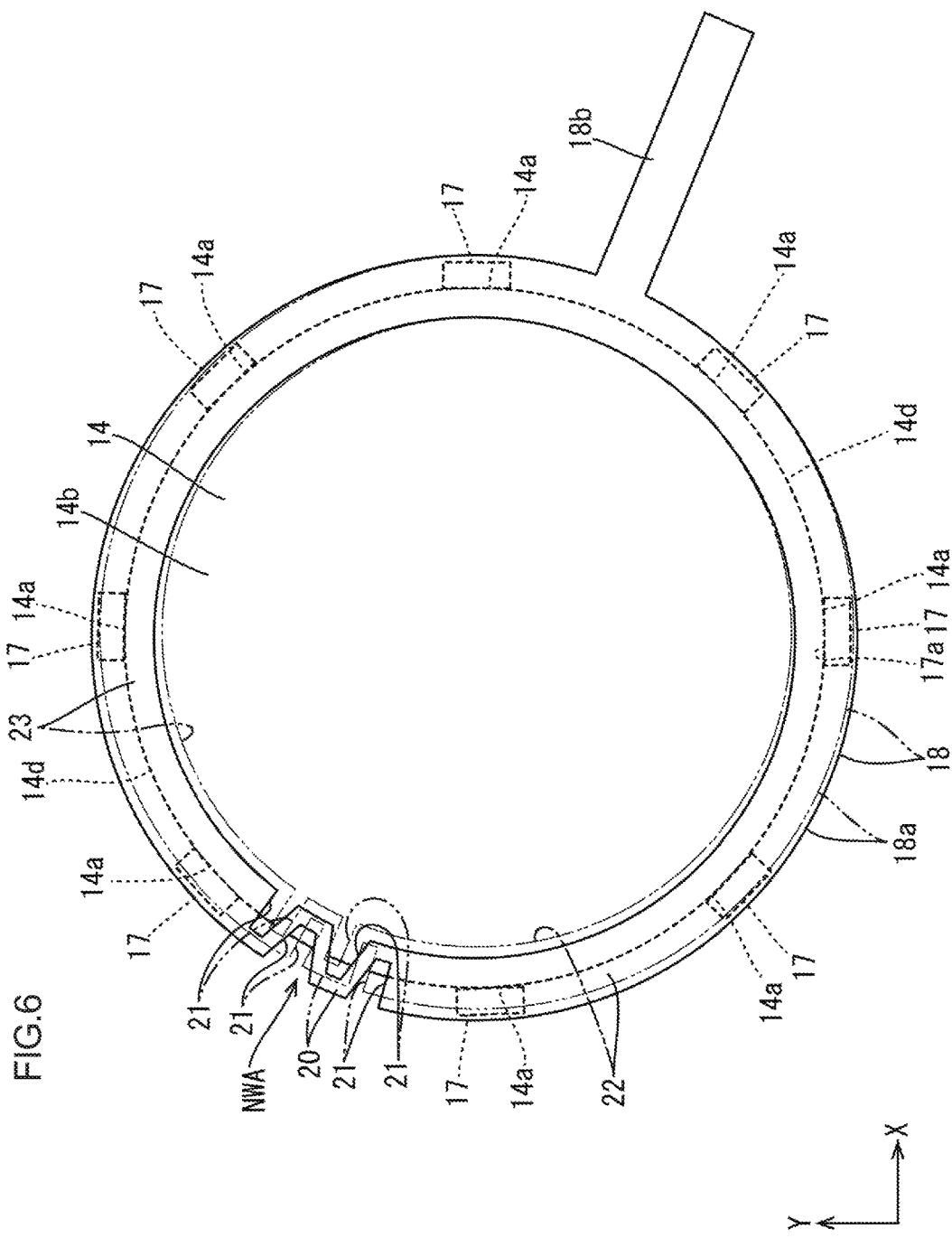
FIG. 6 is a plan view illustrating a light guide plate and the LED board in a state of being deformed so as to expand.

When the liquid crystal display device 10 is assembled, the constituent components of the backlight device 12 are assembled first. During the assembly of the backlight device 12, after the reflection sheet 16 and the light guide plate 14 are accommodated in the chassis 13 for the backlight device 12, the LED board 18 is accommodated and then the optical sheets 15 are successively accommodated. When the LED board 18 illustrated in FIG. 4 is housed in the chassis 13, as illustrated in FIG. 6, the meandering portion 20 is deformed so as to expand the diameter of the board body 18*a*. In FIG. 6, the state prior to the expansion of diameter of the board body 18*a* (before the meandering portion 20 is deformed) is indicated by a dashed-and-double-dotted line. In this case, the meandering portion 20 is deformed so as to expand the width of the slits 21. On the other hand, the board body 18*a* is deformed such that the first extending portion 22 and the second extending portion 23 open with a fulcrum point located where they are linked to the extended portion 18*b*. Then, the light emitting faces 17*a* of the LEDs 17 come in contact with the outer peripheral end face of the light guide plate 14 (light entry faces 14*a*), whereby the LED board 18 is maintained in a state where the distance between the light emitting faces 17*a* of the pair of LEDs 17 opposing each other is matched with the outer diameter dimension of the light guide plate 14. In this case, the meandering portion 20 and the board body 18*a* are both maintained in am expanded state. In this state, the distances between the light emitting faces 17*a* of the LEDs 17 and the light entry faces 14*a* of the light guide plate 14 become substantially the same. Accordingly, the entry efficiency of the light that enters the light entry faces 14*a* from the light emitting faces 17*a* of the LEDs 17 is equalized, whereby brightness variations is made difficult to occur in the light emitted from the light guide plate 14. When the assembly of the constituent components of the backlight device 12 is completed, the liquid crystal panel 11 is assembled to the backlight device 12, whereby the liquid crystal display device 10 is manufactured.

The assembling procedure for the backlight device 12 may be modified, as appropriate, from that described above. For example, the LED board 18 may be assembled to the light guide plate 14 before being housed in the chassis 13, and the light guide plate 14 and the LED board 18 that have been integrated may be housed in the chassis 13 at once.

Figure 7:
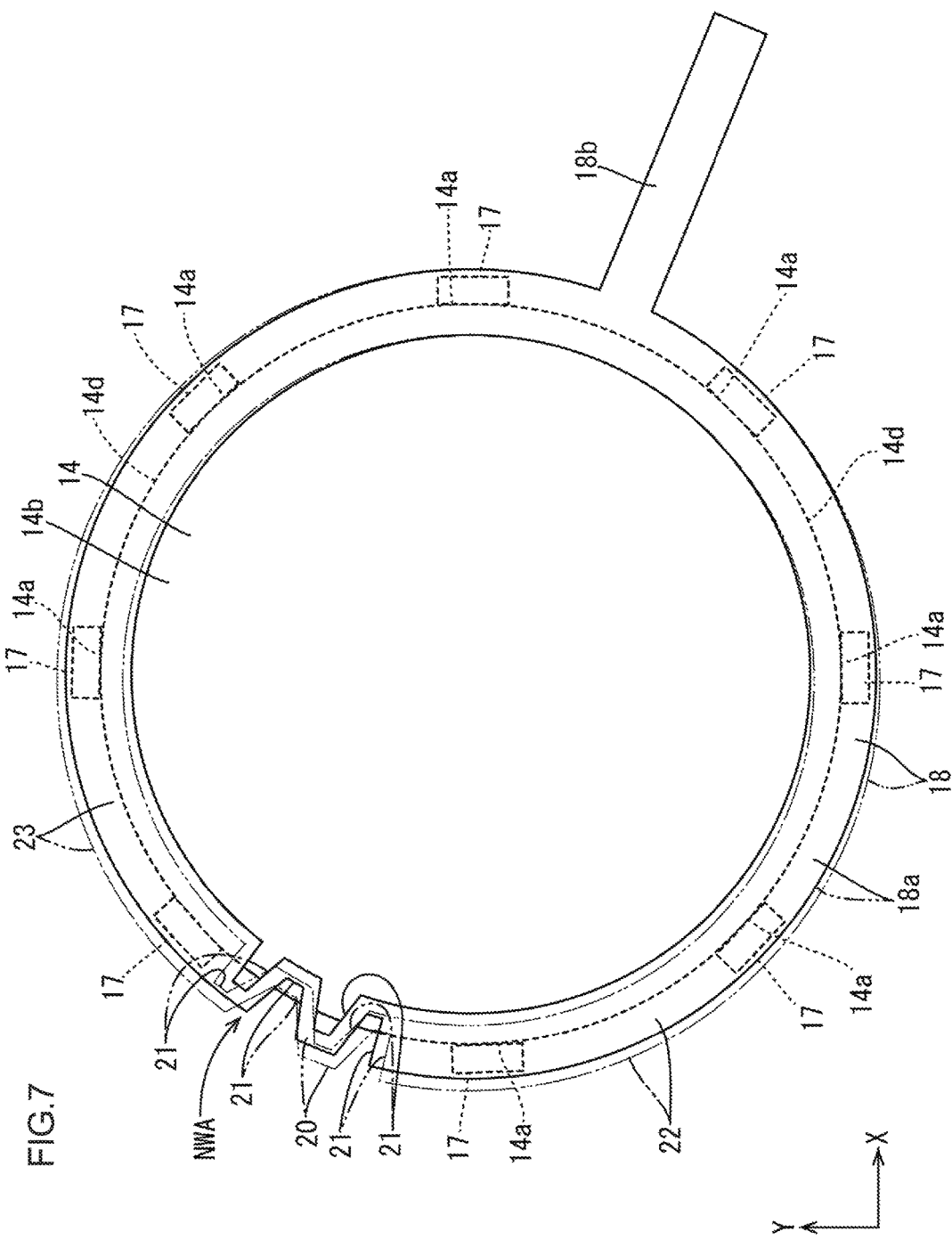
FIG. 7 is a plan view illustrating the light guide plate and the LED board in a state of being deformed so as to contract.

When power supply is provided to the liquid crystal display device 10 manufactured as described above, heat is generated, for example, by the lighting of the LEDs 17. As a result, the temperature of the environment of the backlight device 12, in particular, is increased. As the temperature environment varies, thermal expansion is also caused in the constituent components of the backlight device 12. Among others, when the light guide plate 14 and the LED board 18 are compared, the amount of thermal expansion of the former tends to become greater than the amount of thermal expansion of the latter due to a difference in material. In this case, too, because the LED board 18 includes the expandable and contractible meandering portion 20 in a part of the board body 18*a*, the LEDs 17 can be pressed outward along the radial direction as the light guide plate 14 experiences thermal expansion. That is, as indicated by the dashed-and-double-dotted line in FIG. 7, the meandering portion 20 is deformed and the board body 18*a* is further expanded in diameter. In this way, even if the light guide plate 14 is thermally expanded, a uniform positional relationship can be maintained between the light emitting faces 17*a* of the LEDs 17 and the light entry faces 14*a* of the light guide plate 14. In FIG. 7, the state in which the board body 18*a* has been further expanded in diameter is indicated by the dashed-and-double-dotted line.

On the other hand, when power supply to the liquid crystal display device 10 is turned off, for example due to the LEDs 17 being turned off, the temperature of the environment of the backlight device 12 that has been increased decreases as time elapses. As a result of this change in the temperature environment, the constituent components of the backlight device 12 experience thermal contraction. In this case, the amount of thermal contraction of the light guide plate 14 tends to become greater than the amount of thermal contraction of the LED board 18. In this case, too, because the LED board 18 includes the expandable; and contractible meandering portion 20 in a part of the board body 18*a*, as the light guide plate 14 is thermally contracted, the meandering portion 20 is deformed so as to elastically recover from the state indicated by the dashed-and-double-dotted line in FIG. 7. As a result, as illustrated in FIG. 7, the LEDs 17 are displaced inward along the radial direction, and the board body 18*a* is reduced in diameter. In this case, while the meandering portion 20 is deformed such that the width of the slits 21 becomes narrower, whereas the board body 18*a* is deformed such that the first extending portion 22 and the second extending portion 23 are closed with the fulcrum point located where they are linked with the extended portion 18b. In this way, even when the light guide plate 14 is thermally contracted, a uniform positional relationship can be maintained between the light emitting faces 17a of the LEDs 17 and the light entry faces 14a of the light guide plate 14. In FIG. 7, the state prior to the reduction of the board body 18a in diameter is indicated by the dashed-and-double-dotted line.

As described above, the backlight device (lighting device) 12 according to the present embodiment includes at least: the plurality of LEDs (light source) 17 arranged in an annular and curved shape; the light guide plate 14 surrounded by the plurality of LEDs 17 and having an outer shape conforming to the arrangement of the plurality of LEDs 17, the light guide plate 14 being configured to guide the light from the plurality of LEDs 17; and the LED board (light source board) 18 on which the plurality of LEDs 17 are mounted, and which is formed with the wiring portions 18c configured to feed power to the plurality of LEDs 17, the LED board 18 extending so as to conform to the arrangement of the plurality of LEDs 17 and having a terminated annular shape or an endless annular shape, the LED board 18 including, in a part of the LED board 18 with respect to the circumferential direction, the no-wiring formed region NWA where the wiring portions 18c are not formed.

According to this configuration, the light emitted from the plurality of LEDs 17 arranged in an annular and curved shape is guided by the guide plate 14 surrounded by the plurality of LEDs 17 and having an outer shape conforming to the arrangement of the plurality of LEDs 17. The LED board 18 extending so as to conform to the arrangement of the plurality of LEDs 17 and having a terminated annular shape or an endless annular shape includes, in a part thereof, the no-wiring formed region NWA where the wiring portions 18c are not formed. Accordingly, even when the light source board is deformed so as to entirely contract or expand, the deformation can be absorbed or permitted by the no-wiring formed region NWA, the power feeding by the wiring portions 18c to the LEDs 17 is not readily affected. Accordingly, for example, even when variations are caused in the size of the light guide plate 14 due to manufacturing error and the like, for example, or even when thermal expansion or thermal contraction is caused in the light guide plate 14, the LED board 18 can easily deform as described above without affecting the power feeding to the LEDs 17. This is preferable from the viewpoint of maintaining a uniform positional relationship between the plurality of LEDs 17 and the light guide plate 14 surrounded by the plurality of LEDs 17. In this way, brightness variations are made difficult to occur in the light emitted from the backlight device 12.

The LED board 18 has an endless annular shape, and includes, in the no-wiring formed region NWA, the meandering portion 20 which is at least an expandable portion that can be expanded. In this way, for example, by setting the inner shape dimension of the LED board 18 to be smaller than the outer shape dimension of the light guide plate 14, even when variations are caused in the dimension of the light guide plate 14 or the LED board 18 due to manufacturing error and the like, the meandering portion 20 as an expandable portion can be expanded during the installation of the LED board 18 and the light guide plate 14. Accordingly, the LED board 18 can be easily deformed so as to expand, and the deformed shape of the LED board 18 can be maintained by the light guide plate 14.

The expandable portion includes the meandering portion 20 having a plurality of slits 21 in the LED board 18, and extending, while meandering, along the circumferential direction. In this way, by the plurality of slits 21 in the LED board 18, the meandering portion 20 extending while meandering along the circumferential direction can be expanded along the circumferential direction, whereby the LED board 18 can be deformed so as to expand. The meandering portion 20 as an expandable portion is configured by utilizing a part of the LED board 18. Accordingly, compared with if the expandable portion is made of a different material from the LED board 18, the manufacturing cost of the LED board 18 cam be reduced. The plurality of slits 21 in the LED board 18 may make it easier for cuts and the like to be caused in the meandering portion 20 as a result of expansion. However, because the meandering portion 20 does not have the wiring portions 18c formed therein, the influence on power feeding to the LEDs 17 is avoided.

The LED board 18 includes at least: the board body 18a having a terminated annular shape or an endless annular shape conforming to the arrangement of the plurality of LEDs 17, and on which the plurality of LEDs 17 are mounted, the board body 18a including the wiring portions 18c; and the extended portion 18b extending in the radial direction from a part of the board body 18a with respect to the circumferential direction and having the wiring portions 18c. The LED board 18 also includes the no-wiring formed region NWA disposed on the board body 18a at a position directly opposite the extended portion 18b with respect to the circumferential direction. In this way, the plurality of LEDs 17 mounted on the board body 18a are fed with power via the wiring portions 18c provided respectively on the board body 18a and the extended portion 18b extends in the radial direction from a part of the board body 18a with respect to the circumferential direction. The no-wiring formed region NWA is disposed on the board body 18a at the position directly opposite the extended portion 18b with respect to the circumferential direction. Accordingly, the creepage distances, from the no-wiring formed region NWA to the extended portion 18b, on the board body 18a with respect to the circumferential direction become substantially the same. Accordingly, when the board body 18a is deformed, non-uniformity in the amount of deformation is not readily caused. In this way, failure is made difficult to occur in the plurality of LEDs 17 mounted on the board body 18a.

The LED board 18 includes at least: the board body 18a having a terminated annular shape or an endless annular shape that is along the arrangement of the plurality of LEDs 17, the board body 18a having the plurality of LEDs 17 the wiring portions 18c thereon; and the extended portion 18b extending in the radial direction from a part of the board body 18a with respect to the circumferential direction, and having the wiring portions 18c. The board body 18a includes the first extending portion 22 and the second extending portion 23 which extend, along the circumferential direction, to the no-wiring formed region NWA from the portion where the extended portion 18b is led out. The wiring portions 18c includes the first wiring portion 24 provided in the first extending portion 22, and the second wiring portion 25 provided in the second extending portion 23. In this way, the first extending portion 22 and the second extending portion 23 constituting the board body 18a are respectively provided with the first wiring portion 24 and the second wiring portion 25 constituting the wiring portions 18c. Accordingly, power can be fed to the LEDs 17 mounted on the respective extending portions.

The liquid crystal display device (display device) 10 according to the present embodiment includes the backlight device 12 described above, and the liquid crystal panel (display panel) 11 which performs a display by utilizing the light from the backlight device 12. In the display device thus configured, brightness variations are not readily caused in the backlight device 12 supplying light to the liquid crystal panel 11. Accordingly, a display with an excellent display quality can be achieved.

Second Embodiment

A second embodiment of the present invention will be described with reference to FIG. 8 or FIG. 9. In the second embodiment, an LED board 118 includes an easily deformable portion 26 instead of the meandering portion 20. Redundant descriptions of structures, operations, and effects similar to those of the first embodiment described above are omitted.

Figure 8:
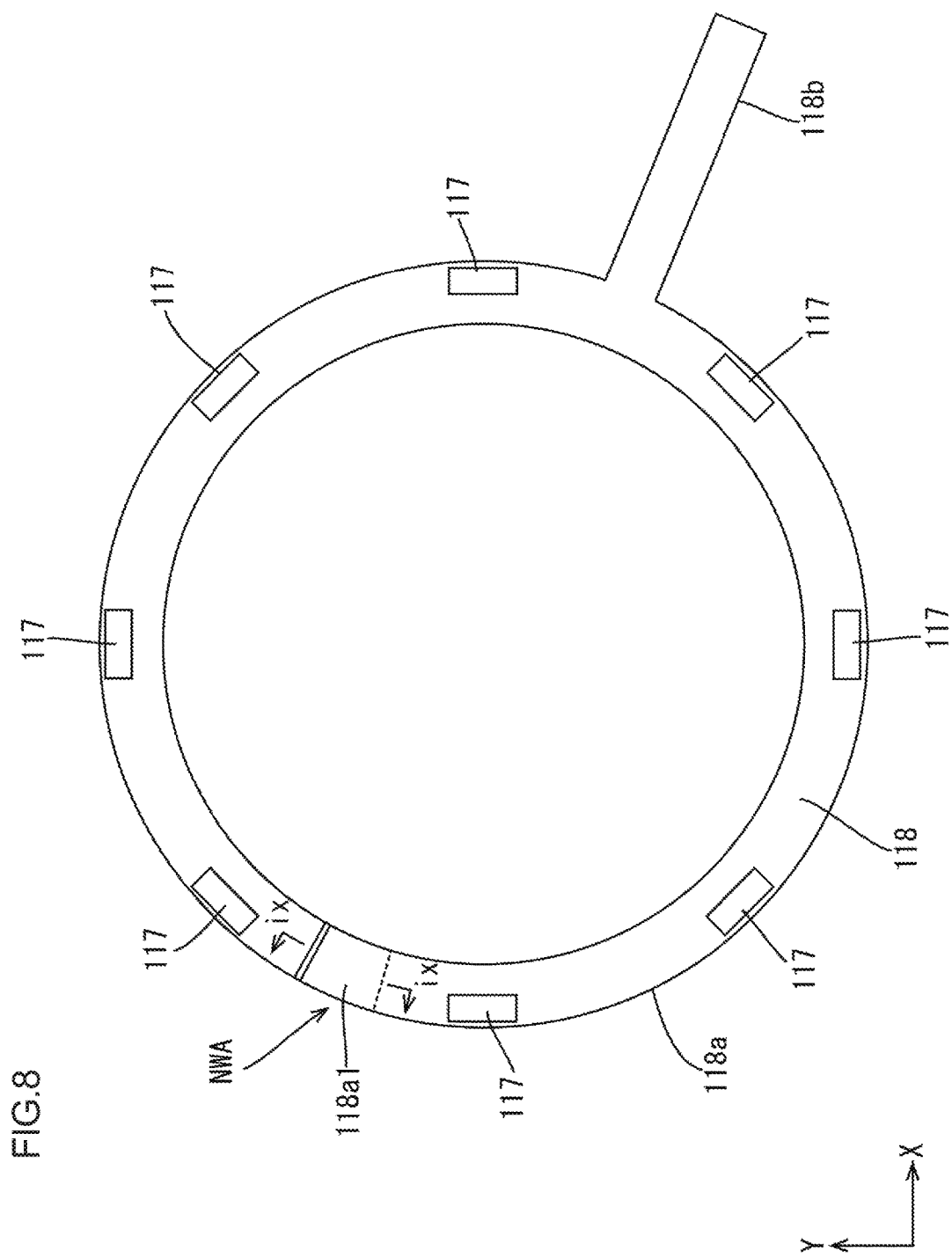
FIG. 8 is a bottom view of an LED board according to a second embodiment of the present invention.
Figure 9:
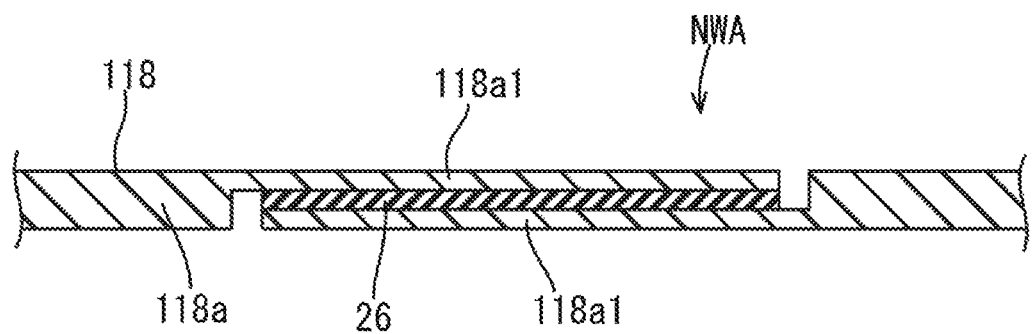
FIG. 9 is a cross sectional view taken along line ix-ix of FIG. 8.

The LED board 118 according to the present embodiment, as illustrated in FIG. 8 and FIG. 9, includes: a board body 118a which has a terminated annular shape, and of which both ends 118a1 with respect to the circumferential direction include the no-wiring formed region NWA; and the easily deformable portion 26 which connects the both ends 118a1 of the board body 118a with respect to the circumferential direction. The easily deformable portion 26 is made of a material more easily deformable than the material of the board body 118a (polyimide, for example). Specifically, the easily deformable portion 26 is made of a rubber material, for example. In this way, the easily deformable portion 26 can be elastically expanded and contracted (expansion and contraction). Accordingly, the LED board 118 can be deformed so as to be smoothly expanded in diameter or reduced in diameter, in accordance with thermal expansion or thermal contraction of the light guide plate, which is not illustrated. In this way, the easily deformable portion 26 is an "expandable portion" and also an "expandable/contractible portion". The both ends 118a1 of the board body 118a with respect to the circumferential direction are formed so as to have a smaller thickness than the other portions of the board body 118a. In addition, the both ends 118a1 have a positional relationship such that they are superposed on each other in the thickness direction. Between the mutually superposed both ends 118a1 of the board body 118a with respect to the circumferential direction, the easily deformable portion 26 is interposed and fixed to each of the both ends 118a1. The easily deformable portion 26 and the no-wiring formed region NWA are disposed on the board body 118a at the position directly opposite from the extended portion 118b with respect to the circumferential direction (the position where the angular interval is approximately 180 degrees).

As described above, according to the present embodiment, the LED board 118 includes the board body 118a extending so as to conform, to the arrangement of the plurality of LEDs 117 and having a terminated annular shape, and the easily deformable portion 26 provided, so as to connect the both ends 118a1 of the board body 118a and made of a material more easily deformable than the material of the board body 118a. The expandable portion includes the easily deformable portion 26. In this way, the expandable portion includes the easily deformable portion 26 provided so as to connect the both ends 118a1 of the board body 118a having a terminated annular shape, and is made of a material more easily deformable than the material of the board body 118a. Accordingly, higher freedom of design concerning ease of expansion in the expandable portion can be achieved.

The easily deformable portion 26 is made of an elastically expandable and contractible elastic material. In this way, when the light guide plate is thermally expanded by a change in thermal environment and then thermally contracted, the easily deformable portion (expandable portion) 26 made of elastic material is elastically contract in accordance with the thermal contraction of the light guide plate. Accordingly, the LED substrate 118 can be deformed so as to contract in conformity to the thermal contraction of the light guide plate.

Third Embodiment

A third embodiment of the present invention will be described with reference to FIG. 10. The third embodiment differs from the second embodiment in that a board body 218a of an LED board 218 has a recess portion 27. Redundant descriptions of structures, operations, and effects similar to those of the second embodiment described above are omitted.

Figure 10:
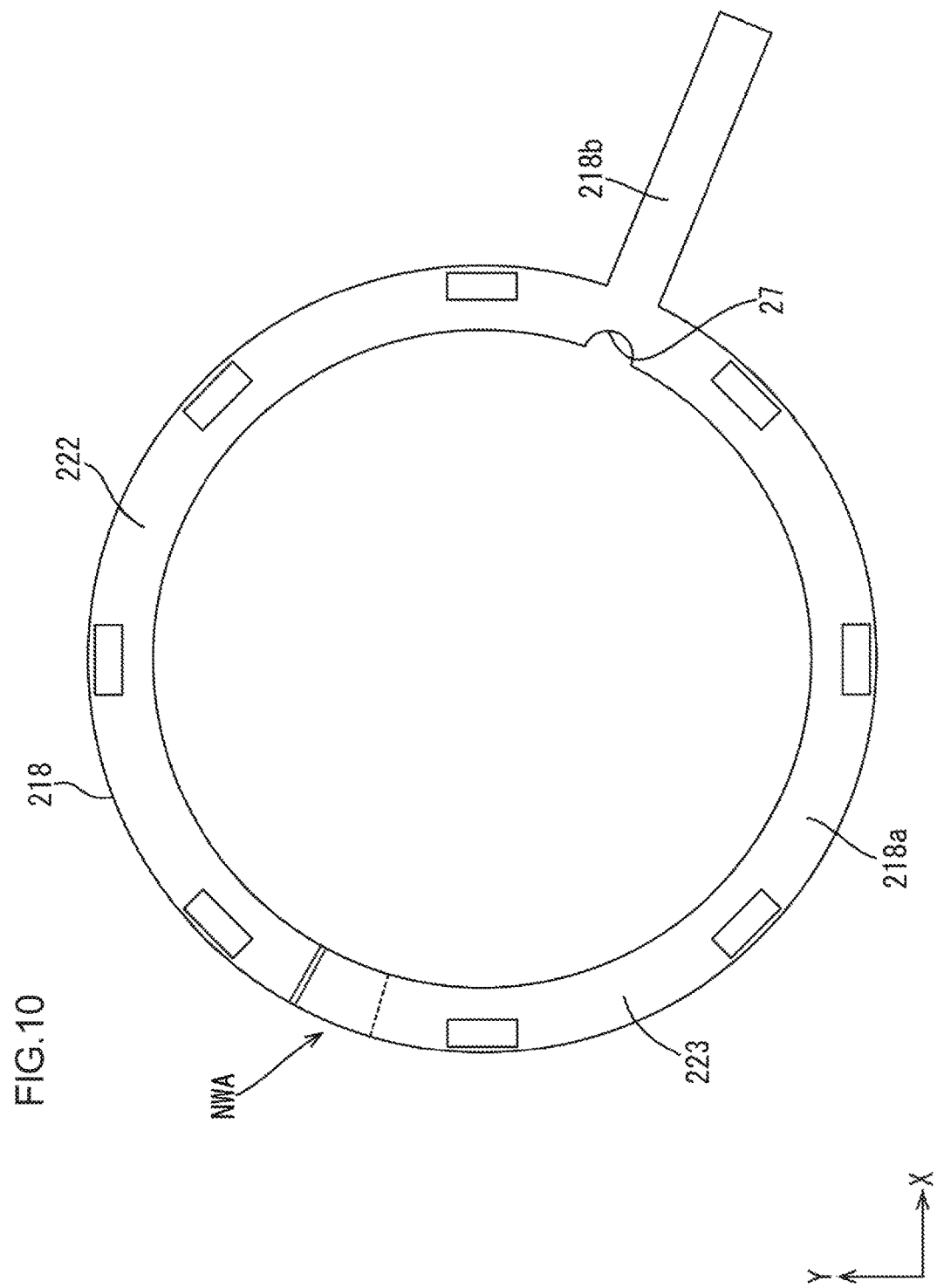
FIG. 10 is a bottom view of an LED board according to a third embodiment of the present invention.

According to the present embodiment, at the part of the board body 218a of the LED board 218 where an extended portion 218b is led out, as illustrated in FIG. 10, the recess portion 27 is provided. The recess portion 27 is formed so as to recess an inner edge portion of the part of the board body 218a where the extended portion 218b is led out. Because the extended portion 218b is positioned and fixed to the chassis, the part of the board body 218a where the extended portion 218b is led out may be subjected to a large stress when the LED board 218 is deformed so as to be expanded in diameter or reduced in diameter. However, by providing the recess portion 27 at the inner edge portion of that part, the generated stress can be absorbed preferably. In other words, the recess portion 27 is arranged at the boundary portion of a first extending portion 222 and a second extending portion 223 of the board body 218a, i.e., at the portion serving as a fulcrum point when the first extending portion 222 and the second extending portion 223 are opened or closed as the LED board 218 is expanded in diameter or reduced in diameter. In this way, the stress that may be generated at the fulcrum point portion when the first extending portion 222 and the second extending portion 223 are opened or closed can be preferably absorbed. In this way, damage to the board body 218a is made difficult to occur. The recess portion 27 has a semi-circular planar shape. The recess portion 27 is disposed on the board body 218a at the position directly opposite from the no-wiring formed region NWA (easily deformable portion, expandable portion) with respect to the circumferential direction (the position where the angular interval is approximately 180 degrees), together with the extended portion 218b.

As described above, according to the present embodiment, the extended portion 218b is led out of the board body 218a outward along the radial direction, and at the part of the board body 218a where the extended portion 218b is led out with respect to the circumferential direction, the recess portion 27 is formed so as to recess the inner edge portion of the part. When the board body 218a is deformed, the part of the board body 218a where the extended portion 218b is led out with respect to the circumferential direction could be subjected to a large stress. Because the part is formed with the recess portion 27 so as to recess the inner edge portion, the generated stress can be absorbed. In this way, damage to the board body 218a is made difficult to occur.

Fourth Embodiment

A fourth embodiment of the present invention will be described with reference to FIG. 11 to FIG. 13. The fourth embodiment differs from the second embodiment in that an LED board 318 includes light guide plate contact portions 28. Redundant descriptions of structures, operations, and effects similar to those of the second embodiment described above are omitted.

Figure 11:
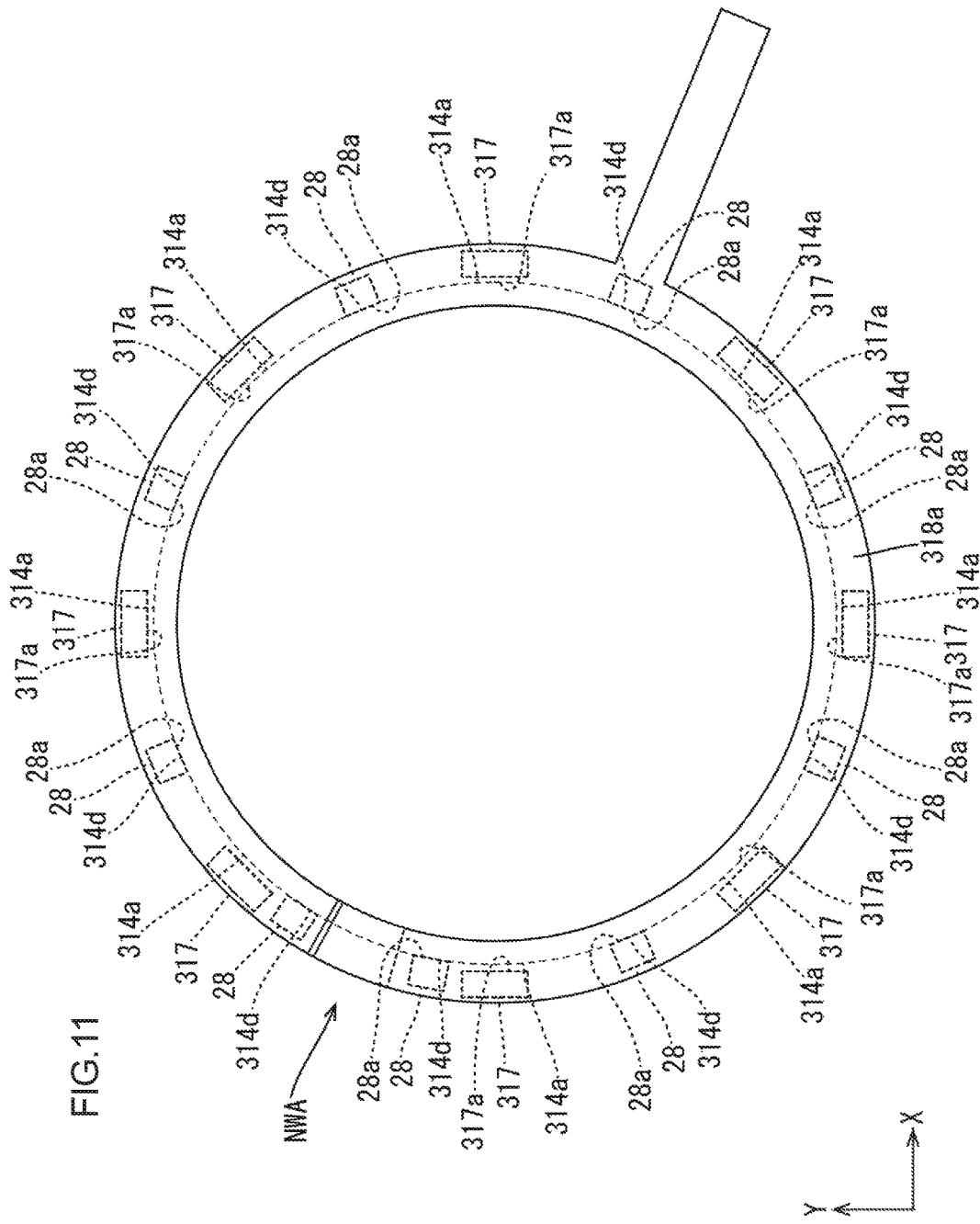
FIG. 11 is a plan view of an LED board and the light guide plate according to a fourth embodiment of the present invention.
Figure 12:
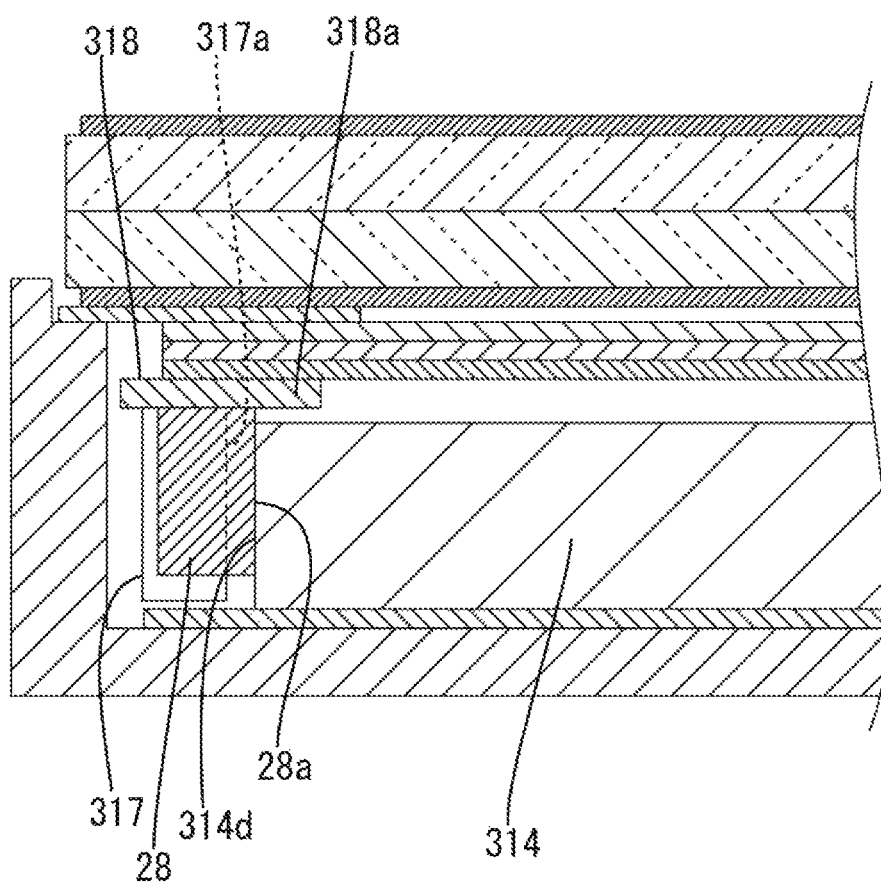
FIG. 12 is a cross sectional view taken across a light guide plate contact portion of a liquid crystal display device.
Figure 13:
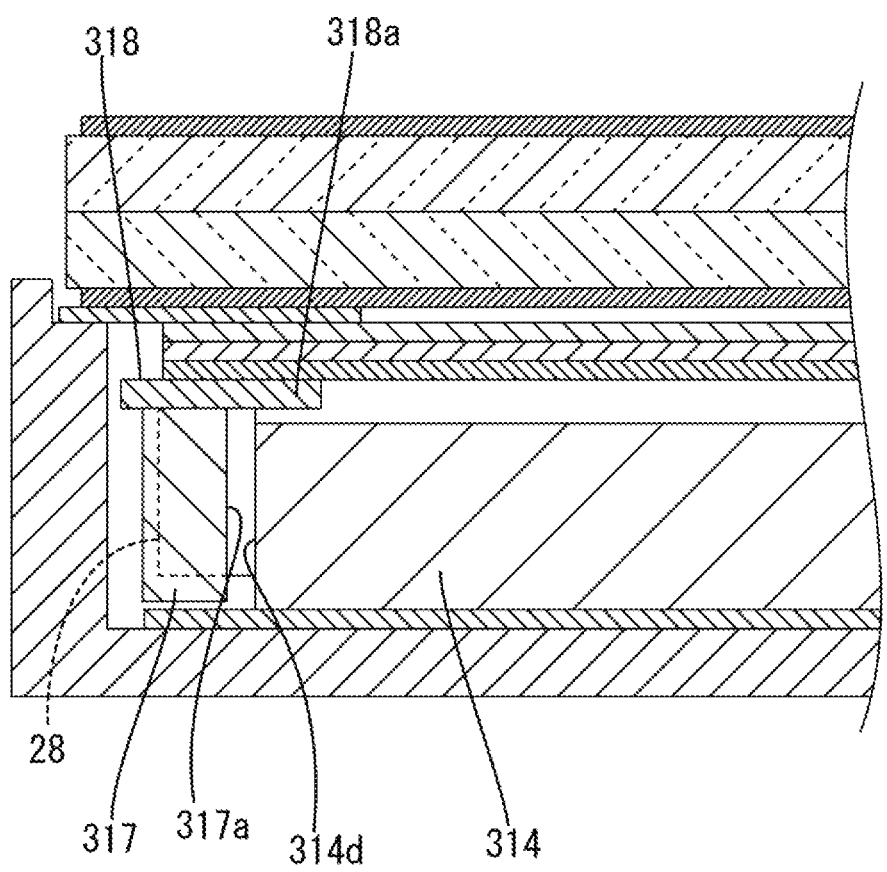
FIG. 13 is a cross sectional view taken across an LED of the liquid crystal display device.

According to the present embodiment, the LED board 318, as illustrated in FIG. 11 to FIG. 13, includes the light guide plate contact portions 28 which are disposed more on the inside than the LEDs 317 with respect to the radial direction, and which are to be in contact with the outer peripheral end face of a light guide plate 314. The light guide plate contact portions 28 are provided so as to protrude from a backside sheet face of the board body 318*a* which is the mounting face for LEDs 317, toward the backside, similarly to the LEDs 317. As a whole, the light guide plate contact portions 28 have a substantially block shape. The light guide plate contact portions 28 have contact faces 28*a* opposing the outer peripheral end face of the light guide plate 314. The contact faces 28*a* are disposed more on the inside than light emitting faces 317*a* of the LEDs 317 with respect to the radial direction of the LED board 318, i.e., closer to the light guide plate 314. In other words, the light emitting faces 317*a* of the LEDs 317 are disposed more on the outside; than the contact faces 28*a* of the light guide plate contact portions 28 with respect to the radial direction of the LED board 318, i.e., farther from the light guide plate 314. Accordingly, when the contact faces 28*a* of the light guide plate contact portions 28 are in contact with the outer peripheral end face of the light guide plate 314, between the light emitting faces 317*a* of the LEDs 317 and a light entry faces 314*a* of the light guide plate 314, a predetermined gap (specifically, a gap corresponding to the distance between the light emitting faces 317*a* and the contact faces 28*a*) is provided, and they are maintained in a non-contact state. In this way, when the light guide plate 314 and the LED board 318 are assembled, the situation is made difficult to occur where the LEDs 317 directly interfere with the light guide plate 314. Accordingly, damage to the LEDs 317 can be avoided.

The light guide plate contact portions 28, as illustrated in FIG. 11, are disposed so as to be sandwiched between LEDs 317 which are adjacent to each other with respect to the circumferential direction of the LED board 318. More specifically, the light guide plate contact portions 28 are disposed at the intermediate position of the adjacent LEDs 317. Accordingly, the contact faces 28*a* of the light guide plate contact portions 28 are to be in contact with non-light entry faces 314*d* of the outer peripheral end face of the light guide plate 314, and not to be in contact with the light entry faces 314*a*. In this way, the situation is made difficult to occur where the light guide plate contact portions 28 interferes with the entry of the light from the LEDs 317 into the light guide plate 314. In addition, by one light guide plate contact portion 28 disposed between LEDs 317 that are adjacent to each other with respect to the circumferential direction, the situation where each of the LEDs 317 adjacent to each other with respect to the circumferential direction interferes with the light guide plate 314 can be preferably avoided.

As illustrated in FIG. 11, a plurality of light guide plate contact portions 28 are disposed so as to sandwich the LEDs 317 with respect to the circumferential direction of the LED board 318. That is, it can be said that on the board body 318*a* of the LED board 318, the light guide plate contact portions 28 and the LEDs 317 are alternately repeatedly provided side by side along the circumferential direction. Accordingly, between the LEDs 317 adjacent to each other with respect to the circumferential direction, the light guide plate contact portions 28 are sandwiched, whereas between the light guide plate contact portions 28 adjacent to each other with respect to the circumferential direction, the LEDs 317 are sandwiched. In this way, two light guide plate contact portions 28 adjacent to each other with respect to the circumferential direction are respectively in contact with the light guide plate 314. Accordingly, the LED 317 sandwiched between these light guide plate contact portions 28 can be more reliably prevented from interfering with the light guide plate 314. A plurality of light guide plate contact portions 28 are disposed so as to sandwich the no-wiring formed region NWA (easily deformable portion, expandable portion) with respect to the circumferential direction on the board body 318*a*. As the light guide plate contact portions 28, it is preferable to use dummy LEDs without the light emitting function. In this way, during the manufacture of the LED board 318, the LEDs 317 and the dummy LEDs serving as the light guide plate contact portions 28 can be respectively mounted in the same mounting step. This is preferable from the viewpoint of reducing manufacturing cost.

As described above, according to the present embodiment, the LED board 318 includes the light guide plate contact portions 28 which are disposed more on the inside than the LEDs 317 with respect to the radial direction, and which are to be in contact with the light guide plate 314. In this way, for example, by setting the inner shape dimension of the LED board 318 to be smaller than the outer shape dimension of the light guide plate 314, even when variations are caused in the dimension of the light guide plate 314 or the LED board 318 due to manufacturing error and the like, the LED board 318 can be deformed so as to expand as the light guide plate contact portions 28 come in contact with the light guide plate 314 during the installation of the LED board 318 and the light guide plate 314. In this case, the light guide plate 314 is prevented from directly interfering with the LEDs 317. Accordingly, the situation in which damage is caused to the LEDs 317 can be avoided.

The light guide plate contact portions 28 are disposed between the LEDs 317 adjacent to each other with respect to the circumferential direction. In this way, compared with if the light guide plate contact portions were disposed between the LEDs 317 and the light guide plate 314 with respect to the radial direction, the situation in which the light guide plate contact portions 28 interfere with the entry of the light from the LEDs 317 into the light guide plate 314 is made difficult to occur. In addition, by the light guide plate contact portions 28, the situation in which each of the LEDs 317 adjacent to each other with respect to the circumferential direction interferes with the light guide plate 314 can be preferably avoided.

A plurality of light guide plate contact portions 28 are disposed so as to sandwich the LEDs 317 with respect to the circumferential direction. In this way, compared with if the light guide plate contact portions were disposed so as to be adjacent to the LEDs 317 only on one side with respect to the circumferential direction, the reliability with which the LEDs 317 can be prevented from interfering with the light guide plate 314 can be further increased.

Fifth Embodiment

A fifth embodiment of the present invention will be described with reference to FIG. 14 or FIG. 15. The fifth embodiment differs from the first embodiment in that an LED board 418 is formed in a terminated annular shape.

Redundant descriptions of structures, operations, and effects similar to those of the first embodiment described above are omitted.

Figure 14:
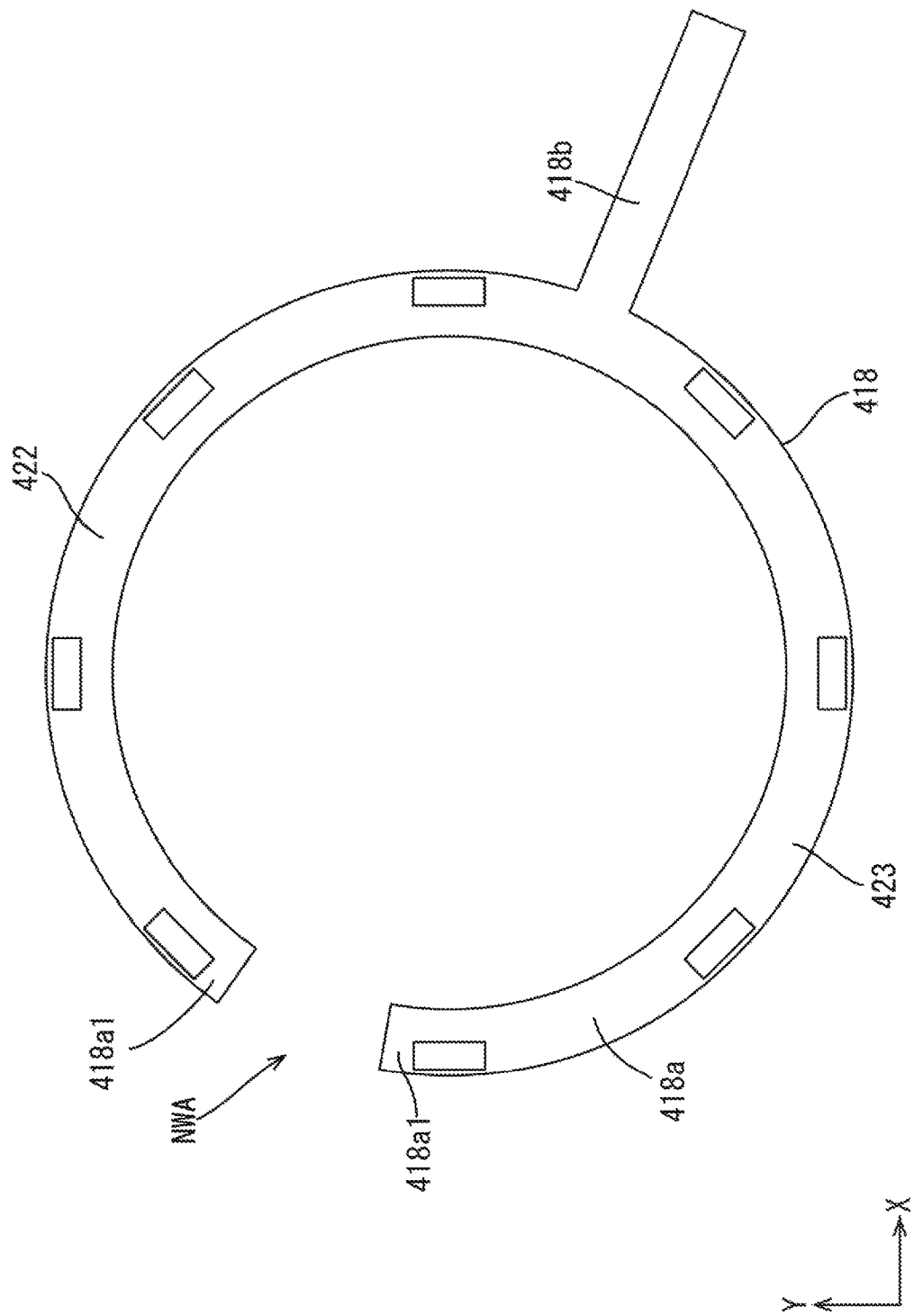
FIG. 14 is a bottom view of an LED board according to a fifth embodiment of the present invention.

According to the present embodiment, the LED board 418, as illustrated in FIG. 14, is formed in a terminated annular shape, and includes the no-wiring formed region NWA sandwiched between both ends 418a1 thereof. Specifically, the LED board 418 includes a board body 418a of which a portion directly opposite from a extended portion 418b with respect to the circumferential direction (the portion with the angular interval of approximately 180 degrees) is cut out, the cut-out portion providing the no-wiring formed region NWA. In this way, the board body 418a is formed in a terminated annular shape so that a first extending portion 422 and a second extending portion 423 are each cantilevered. The board body 418a can be deformed such that the first extending portion 422 and the second extending portion 423 can be opened or closed using the portion continuous with the extended portion 418b as a fulcrum point. In this way, the LED board 418 as a whole can be deformed so as to be expanded in diameter or reduced in diameter.

Figure 15:
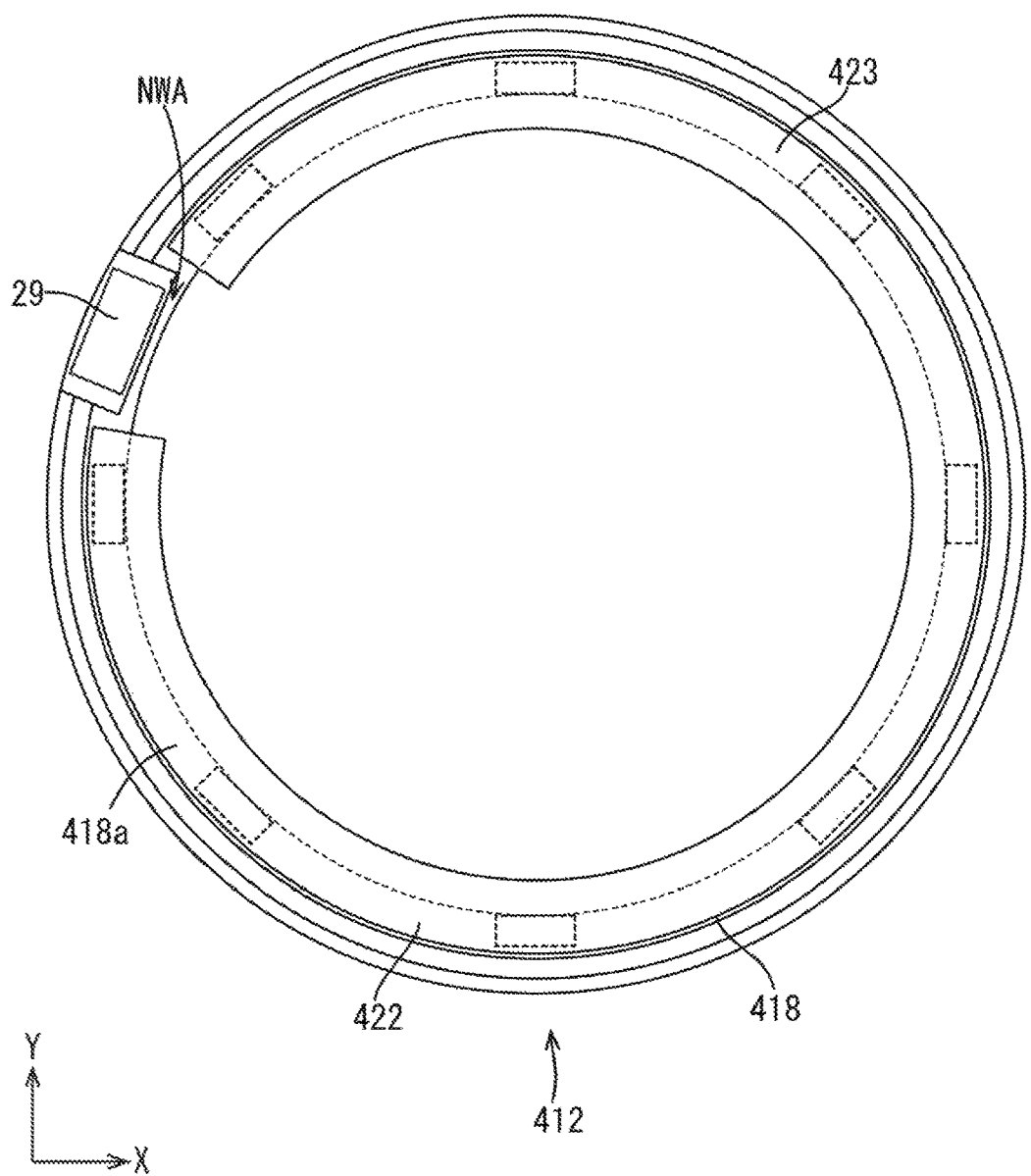
FIG. 15 is a plan view of the backlight device.

According to the present embodiment, a backlight device 412, as illustrated in FIG. 15, includes functional components 29, such as a camera (imaging element), an luminance sensor (sensor), a button (switch), and a power supply connector (connector). The functional components 29 are disposed so as to be housed in the no-wiring formed region NWA, which is sandwiched between the both ends 418a1 of the LED board 418 having the terminated annular shape. That is, the functional components 29 have a positional relationship such that they are superposed with the board body 418a with respect to the radial direction of the LED board 418. In this way, the no-wiring formed region NWA can be effectively utilized as a space where the functional components 29 are housed. Accordingly, compared with if the functional components are arranged with a displacement on the outside or inside with respect to the radial direction of the board body 418a, the backlight device 412 can include a narrower frame.

As described above, according to the present embodiment, the LED board 418 has a terminated annular shape, and includes the no-wiring formed region NWA sandwiched between the both ends 418a1 thereof. In this way, the LED board 418 having the terminated annular shape, by being configured to include the no-wiring formed region NWA between the both ends 418a1 thereof, can be deformed so as to entirely contract or expand.

The lighting device of the present invention includes the functional components 29 such as the imaging element, the sensor, the switch, and the connector, and the functional components 29 are housed in the no-wiring formed region NWA sandwiched between the both ends 418a1 of the LED board 418. In this way, the no-wiring formed region NWA disposed so as to be sandwiched between the both ends 418a1 of the LED board 418 having a terminated annular shape, can be effectively utilized as a space where the functional components 29 are housed. In this way, compared with if the functional components are disposed outside or inside the LED board 418 with respect to the radial direction, a narrower frame can be obtained.

Sixth Embodiment

A sixth embodiment of the present invention will be described with reference to FIG. 16 or FIG. 17. The sixth embodiment differs from the first embodiment in that the number of LEDs 517 mounted on an LED board 518, and wiring portions 518c, 518d are modified. Redundant descriptions of structures, operations, and effects similar to those of the first embodiment described above are omitted.

Figure 16:
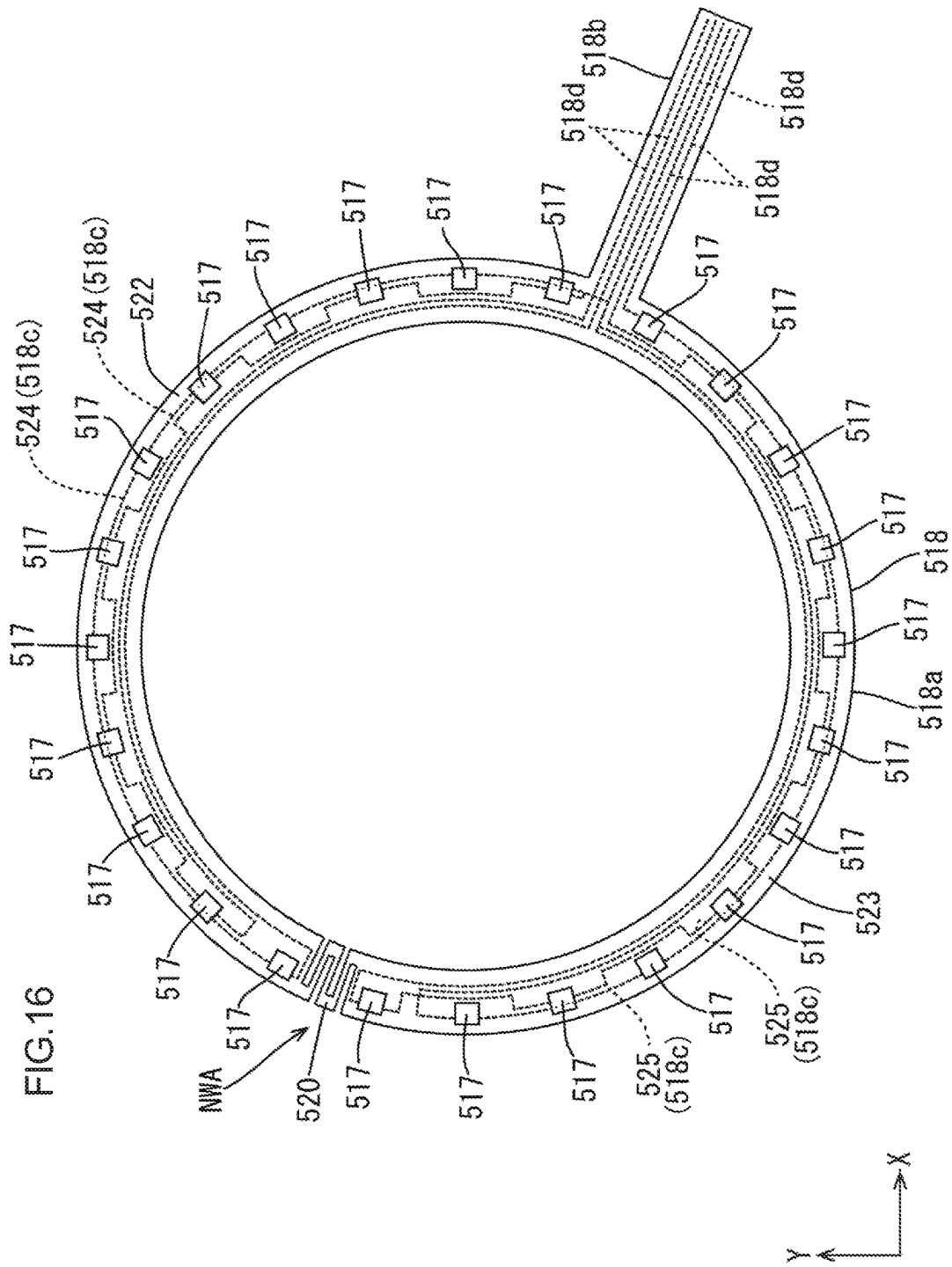
FIG. 16 is a bottom view of an LED board according to a sixth embodiment of the present invention.

According to the present embodiment, the LED board 518, as illustrated in FIG. 16, includes a total of 24 LEDs 517. The 24 LEDs 517 are arranged side by side at regular angular intervals on a board body 518a. More specifically, the 24 LEDs 517 are arranged at angular intervals of approximately 15 degrees with respect to the circumferential direction. The same number (12) of the LEDs 517 are mounted on each of a first extending portion 522 and a second extending portion 523 constituting the board body 518a.

The configuration of a wiring port ion 518c of the board body 518a and extended wiring portions 518d of a extended portion 518b will be described. The extended portion 518b, as illustrated in FIG. 16 and FIG. 17, includes two anode-side feeding terminal portions 518d1, and four cathode-side feeding terminal portions 518d2. The extended wiring portions 518d include one which is commonly continuous with the two anode-side feeding terminal portions 518d1, and four which are individually continuous with the four cathode-side feeding terminal portions 518d2. On the other hand, the wiring portion 518c of the board body 518a is configured from two first wiring portions 524 provided in a first extending portion 522, and two second wiring portions 525 provided in a second extending portion 523. That is, the LED board 518 has four power feeding systems. The two each of the first wiring portions 524 and the second wiring portions 525 extend so as to conform to the first extending portion 522 and the second extending portion 523, and are routed and formed so as to be folded at the portion on the side of the meandering portion 520 (no-wiring formed region NWA), with both ends respectively connected to the extended wiring portions 518d of the extended portion 518b.

Figure 17:
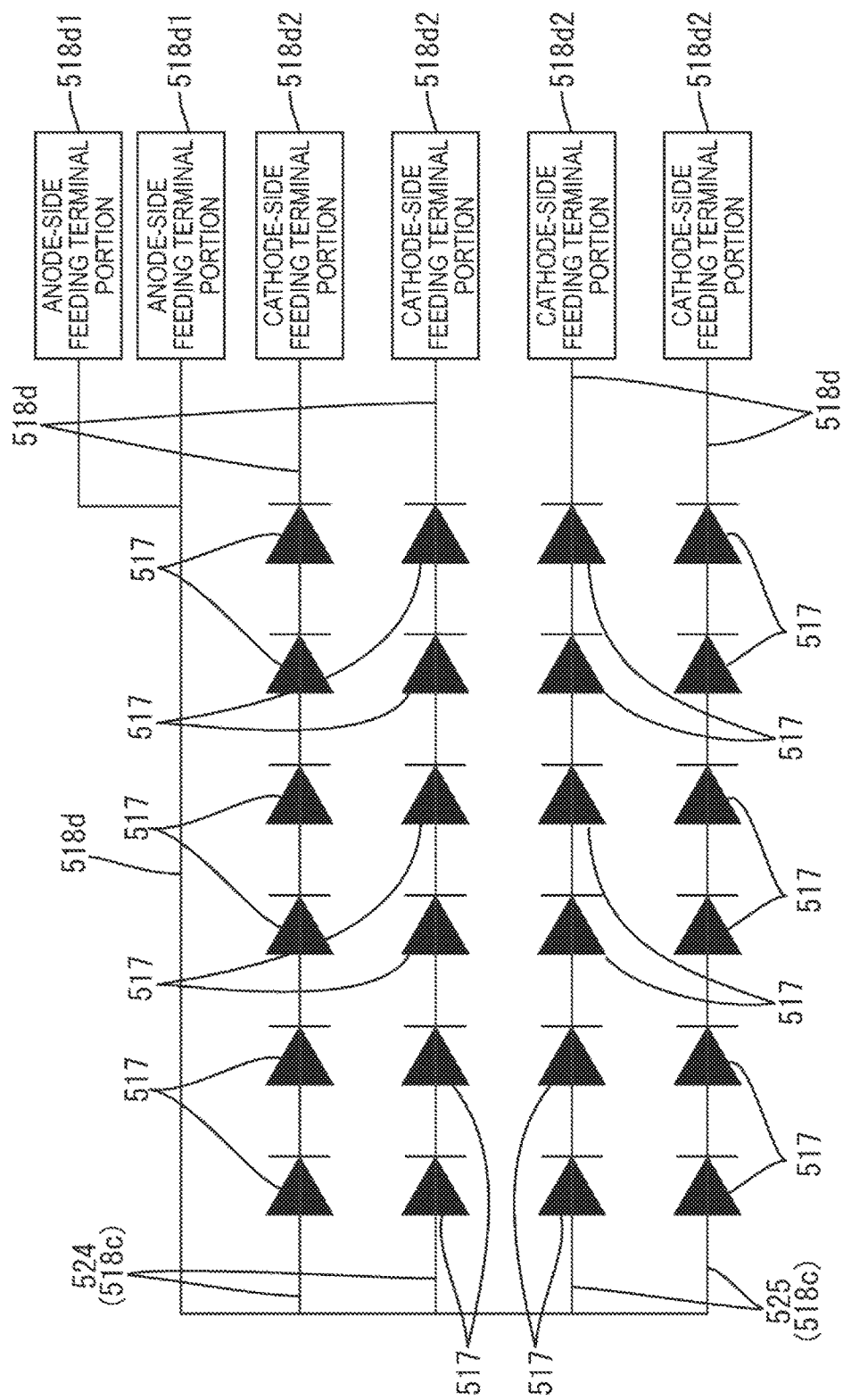
FIG. 17 is a circuit diagram illustrating a circuit configuration of the LED board.

The two each of the first wiring portions 524 and the second wiring portions 525, as illustrated in FIG. 16 and FIG. 17, are connected to every other one of the LEDs 517 arranged along the circumferential direction in the first extending portion 522 and the second extending portion 523. Specifically, of the two first wiring portions 524, one first wiring portion 524 is connected, of the LEDs 517 arranged along the circumferential direction in the first extending portion 522, to the six odd-numbered LEDs 517 counted from the extended port ion 518b side. On the other hand, the other first wiring portion 524 is connected, of the LEDs 517 arranged along the circumferential direction in the first extending portion 522, to the six even-numbered LEDs 517 counted from the extended portion 518b side. Similarly, of the two second wiring portions 525, one second wiring portion 525 is connected, of the LEDs 517 arranged along the circumferential direction in the second extending portion 523, to the six odd-numbered LEDs 517 counted from the extended portion 518b side. On the other hand, the other second wiring portion 525 is connected, of the LEDs 517 arranged along the circumferential direction in the second extending portion 523, to the six even-numbered LEDs 517 counted from the extended portion 518b side. The LED board 518 has the circuit configuration described above, so that the LEDs 517 disposed in the first extending portion 522 and the second extending portion 523 are respectively driven with a direct-current.

As described above, according to the present embodiment, the wiring portion 518c includes a plurality each of the first wiring portions 524 and the second wiring portions 525. In this way, for example, when the plurality of LEDs 517 mounted on the LED board 518 are driven with a direct-current, the power feeding system for the LEDs 517 mounted on the respective extending portions 522, 523 can be divided into a plurality of systems. This is particularly preferable when the number of LEDs 517 mounted on the LED board 518 is large.

Seventh Embodiment

A seventh embodiment of the present invention will be described with reference to FIG. 18 or FIG. 19. The seventh embodiment differs from the first embodiment in that wiring portions 618c, 618d of LED boards 618 are modified. Redundant descriptions of structures, operations, and effects similar to those of the first embodiment described above are omitted.

Figure 18:
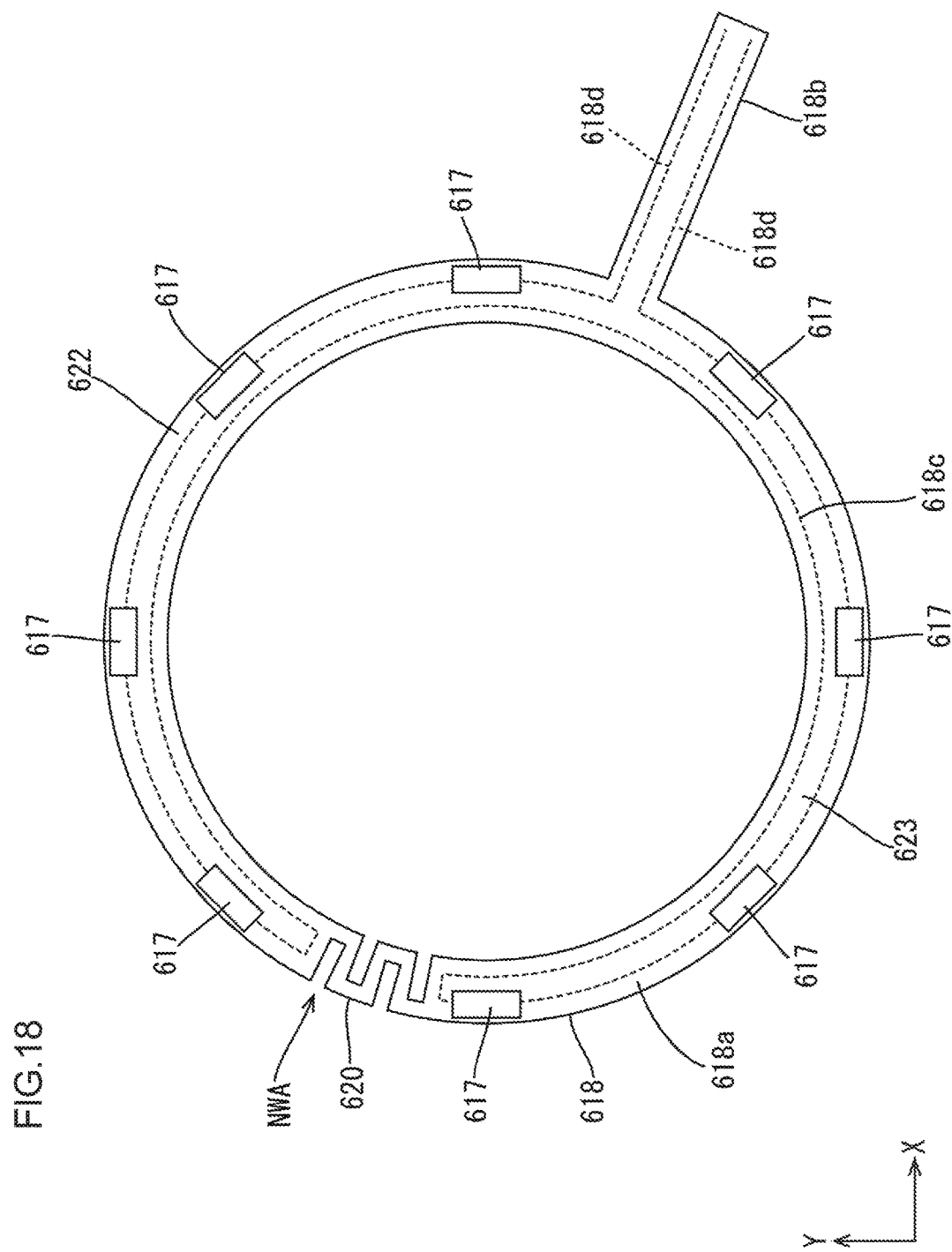
FIG. 18 is a bottom view of an LED board according to a seventh embodiment of the present invention.
Figure 19:
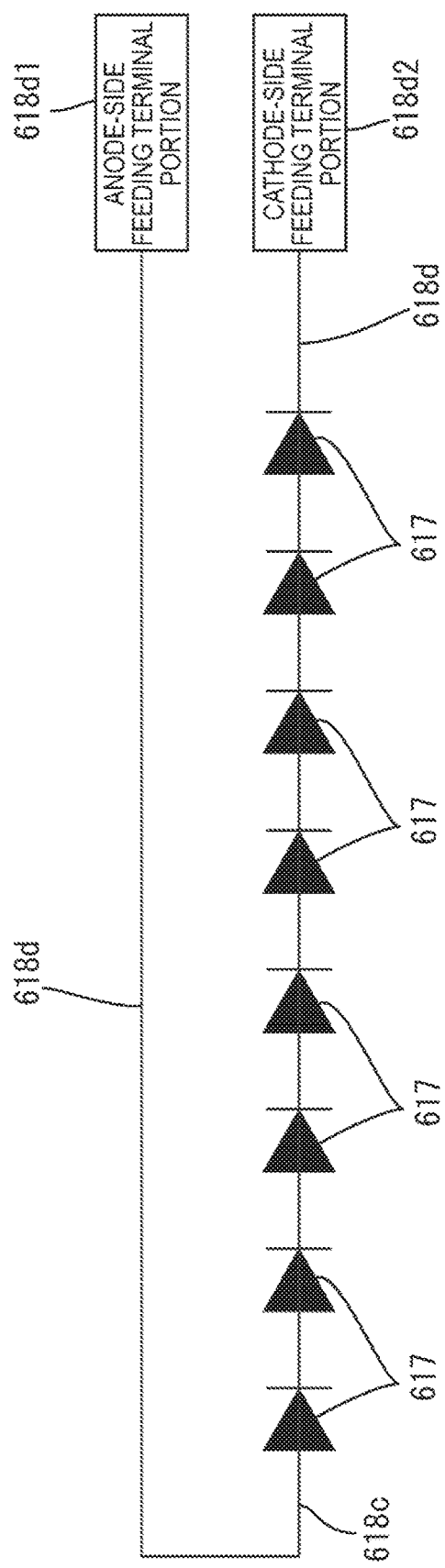
FIG. 19 is a circuit diagram illustrating a circuit configuration of the LED board.

According to the present embodiment, a extended portion 618b of the LED board 618, as illustrated in FIG. 18 and FIG. 19, includes one anode-side feeding terminal portion 618d1, and one cathode-side feeding terminal portion 618d2. The extended wiring portions 618a include one continuous with the anode-side feeding terminal portion 618d1, and one continuous with the cathode-side feeding terminal portion 618d2. The wiring portion 618c of the board body 618a, on the other hand, is routed and formed so as to spam between a first extending portion 622 and a second extending portion 623. The wiring portion 618c extends so as to conform to the first extending portion 622 and the second extending portion 623, and is routed and formed so that the portions on the side of the meandering portion 620 (no-wiring formed region NWA) are respectively folded, with both ends respectively connected to the extended wiring portions 618a of the extended portion 618b. That is, the LED board 618 has a single power feeding system, where the single wiring portion 618c is connected to all of LEDs 617 mounted on the board body 618a while traversing the LEDs 617. The LED board 618 has the above-described circuit configuration, so that the LEDs 617 provided in the first extending portion 622 and the second extending portion 623 can be respectively driven with a direct-current.

Eighth Embodiment

An eighth embodiment of the present invention will be described with reference to FIG. 20. The eighth embodiment differs from the second embodiment in that the location of the no-wiring formed region NWA is modified. Redundant descriptions of structures, operations, and effects similar to those of the second embodiment described above are omitted.

Figure 20:
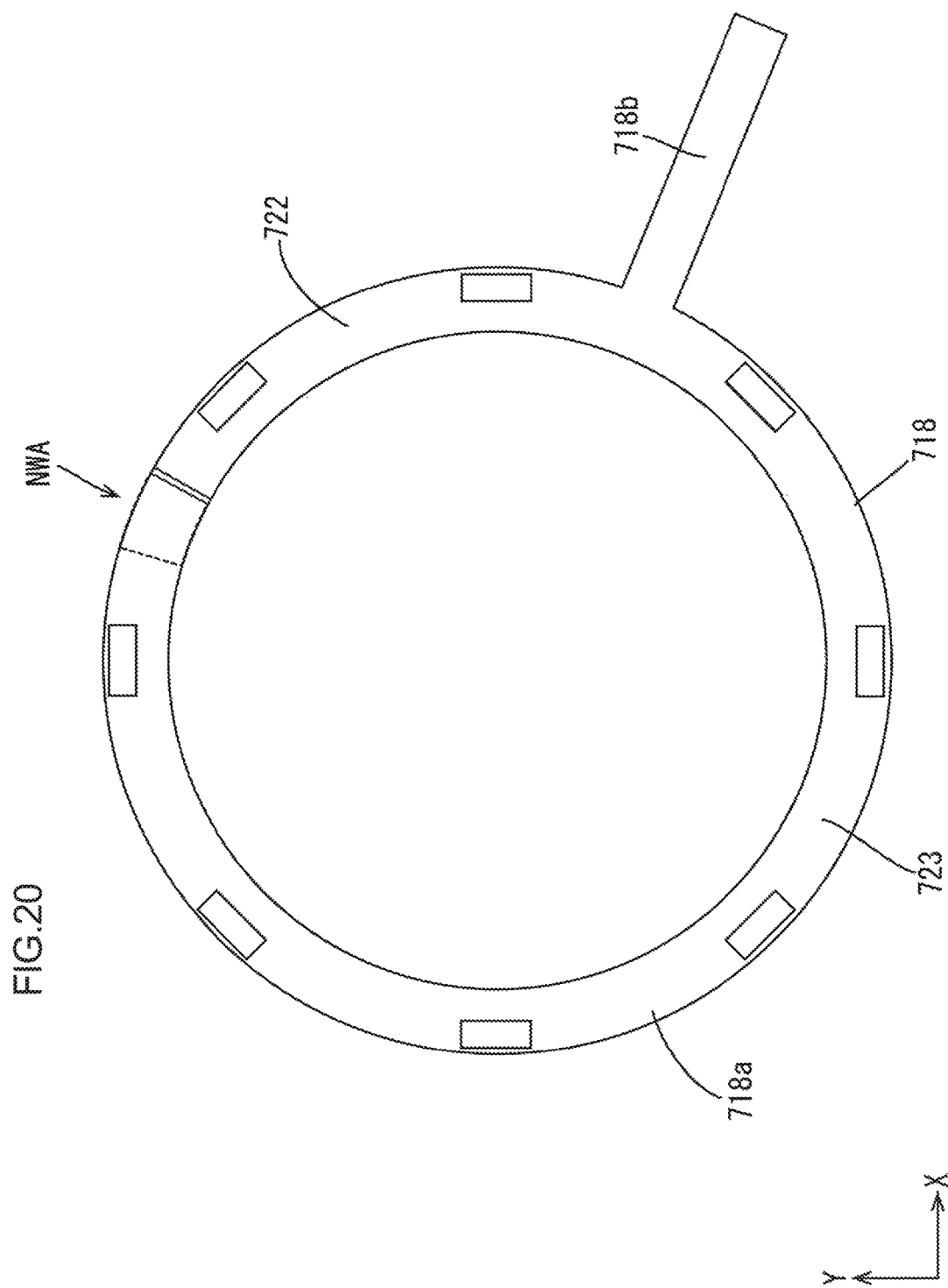
FIG. 20 is a bottom view of a LED board according to an eighth embodiment of the present invention.

According to the present embodiment, the no-wiring formed region NWA (easily deformable portion, expandable portion), as illustrated in FIG. 20, is disposed at a position on the board body 718a which is at an angular interval of approximately 90 degrees with respect to a extended portion 718b with respect to the circumferential direction. Accordingly, a first extending portion 722 and a second extending portion 723 of the board body 718a have different length dimensions (extended lengths), and the second extending portion 723 is longer than the first extending portion 722.

Ninth Embodiment

A ninth embodiment of the present invention will be described with reference to FIG. 21. The ninth embodiment differs from the second embodiment in that a fixing structure for a board body 818a of an LED board 818 and an easily deformable portion 826 is modified. Redundant descriptions of structures, operations, and effects similar to those of the second embodiment described above are omitted.

Figure 21:
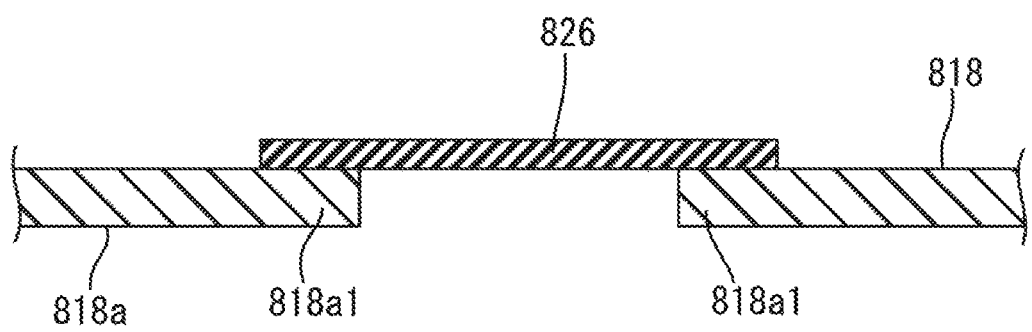
FIG. 21 is a cross sectional view of a no-wiring formed region of an LED board according to a ninth embodiment of the present invention.

According to the present embodiment, both ends 818a1 of the board body 818a with respect to the circumferential direction, as illustrated in FIG. 21, are arranged with an interval provided therebetween with respect to the circumferential direction. The easily deformable portion 826 is disposed so as to span between one end 811a1 and the other end 818a1 of the board body 818a with respect to the circumferential direction, and is fixed to the both ends 818a1.

Other Embodiments

The present invention is not limited to the above embodiments explained in the above description and described with reference to the drawings. The following embodiments may be included in the technical scope of the present invention, for example.

(1) In the foregoing embodiments, the light guide plate, the LED board and the like have circular outer shapes. However, the present invention is also applicable to a configuration in which the light guide plate, the LED board and the like have an oval outer shape. Other than oval, the outer shape of the light guide plate, the LED board and the like may include a planar shape in which a plurality of circular or oval shapes are connected.

(2) In the first, sixth, and seventh embodiments, the meandering portion is provided by forming a plurality of slits of a constant width in the board body of the LED board. However, the meandering portion may also be provided by forming a plurality of cuts with hardly any width in the board body of the LED board.

(3) In the foregoing first, sixth, and seventh embodiments, the meandering portion is configured to meander so as to extend along the circumferential direction of the LED board. However, a configuration may be adopted in which at least a part of the meandering portion meanders so as to extend along the radial direction of the LED board.

(4) Other than the foregoing first, sixth, and seventh embodiments, the number, location and the like of the slits provided in the board body of the LED board may be modified as appropriate. Other than the configuration in which all of the slits have the same width, a configuration may be adopted in which a slit with a different width is included.

(5) Other than the foregoing first, sixth, and seventh embodiments, the location, range of formation and the like of the meandering portion (no-wiring formed region) with respect to the circumferential direction on the board body of the LED board may be modified as appropriate.

(6) While in the foregoing second embodiment, the configuration in which the easily deformable portion is made of rubber material has been described, other than the configuration, it is also possible to configure the easily deformable portion from an elastically expandable and contractible spring member, for example. It is also possible to adopt a configuration in which the easily deformable portion is made of expandable and contractible synthetic resin material and the like.

(7) Other than the foregoing second to fourth, eighth, and ninth embodiments, the location, the range of formation and the like of the easily deformable portion (no-wiring formed region) with respect to the circumferential direction on the board body of the LED board may be modified as appropriate.

(8) While in the foregoing third embodiment, the case in which the recess portion has a semi-circular planar shape has been described, the planar shape of the recess portion may be modified as appropriate, such as to a triangular, rectangular, or semi-oval shape.

(9) While in the foregoing fourth embodiment, the case has been described by way of example in which, on the board body of the LED board, the LEDs and the light guide plate contact portions are alternately arranged along the circumferential direction, it is also possible to arrange a plurality of LEDs sandwiched between the light guide plate contact portions adjacent to each other with respect to the circumferential direction, or, conversely, to arrange a plurality of light guide plate contact portions sandwiched between the LEDs adjacent to each other with respect to the circumferential direction. A configuration may also be adopted in which the light guide plate contact portions are unevenly distributed so as to be relatively close to one of the LEDs adjacent to each other with respect to the circumferential direction.

(10) While in the foregoing fourth embodiment, the examples have been described in which the light guide plate contact portions nave a substantially block shape, it is also possible to form the contact faces of the light guide plate contact portions in an arc shape conforming to the outer peripheral end face of the light guide plate. The height dimension, width dimension, thickness dimension and the like of the light guide plate contact portions may be modified as appropriate.

(11) Other than the foregoing fifth embodiment, the location, the range of formation and the like of the no-wiring formed region with respect to the circumferential direction on the board body of the LED board may be modified as appropriate.

(12) Other than the foregoing first, sixth, and seventh embodiments, the specific number of the LEDs mounted on the LED board may be modified as appropriate. The specific number of the LEDs mounted respectively on the first extending portion and the second extending portion of the board body of the LED board may also be modified as appropriate.

(13) Other than the foregoing first, sixth, and seventh embodiments, the specific routing path, the number installed, the manner of mutual connection and the like of the wiring portions and the extended wiring portions on the LED board may be modified as appropriate.

(14) It is also possible to provide the recess portion described with reference to the third embodiment in the LED board described in other embodiments except for the second embodiment (the first, and fourth to ninth embodiments).

(15) It is also possible to provide the light guide plate contact portions described with reference to the fourth embodiment on the LED board described in other embodiments except for the second embodiment (the first and fourth to ninth embodiments).

(16) It is also possible to combine the technical features described with reference to the fifth embodiment with those of the sixth to eighth embodiments.

(17) It is also possible to combine the technical features described with reference to the sixth and seventh embodiments with those of the eighth and ninth embodiments.

(18) It is also possible to mutually combine the technical features described in the eighth and ninth embodiments.

(19) While in the foregoing embodiments, the case has been described in which the LED board is fixed to an optical sheet (diffuser sheet), the LED board may not be fixed to an optical sheet.

(20) While in the foregoing embodiments, the configuration has been described by way of example in which the LED board is disposed so as to be superposed with the light guide plate on the upper side, the present invention is also applicable to a configuration in which the LED board is disposed so as to be superposed with the light guide plate and the reflection sheet on the backside. In this case, the LEDs will be mounted on the upper-side sheet face of the LED board.

(21) While in the foregoing embodiments, the examples nave been described in which the LEDs are of the side-emitting type, it is also possible to use top-emitting type LEDs.

(22) While in the foregoing embodiments, the examples have been described in which the LED board is made of a film-shaped base material, it is also possible to adopt a configuration in which the base material of the LED substrate is board-like with a constant thickness.

(23) While in the foregoing embodiments, the light source has been described as being LEDs, an organic EL and the like may also be used as the light source.

(24) While in the foregoing embodiments, the examples have been described in which the liquid crystal panel includes the color filters with the coloring portions having the three colors of R, G, and B, the coloring portions may have four or more colors.

(25) Other than the foregoing embodiments, the present invention is also applicable to a liquid crystal display device equipped with a touch panel, a parallax barrier panel, a cover glass and the like.

(26) While in the foregoing embodiments, a transmitting liquid crystal display device has been described, the present invention is also applicable to a semi-transmitting liquid crystal display device.

(27) In the foregoing embodiments, TFTs are used as the switching elements of the liquid crystal display device. However, the present invention is also applicable to a liquid crystal display device using switching elements other than TFT (for example, thin-film diode (TFD)). The present invention is also applicable to not just a liquid crystal display device for color display but also a liquid crystal display device for black and white display.

(28) In the foregoing embodiments, the pixel electrodes are disposed on the array substrate side of the liquid crystal panel, and the counter electrodes are disposed on the CF substrate side. However, it is also possible to use a liquid crystal panel in which the pixel electrodes and the counter electrodes are both disposed on the array substrate side. Such liquid crystal panel may preferably be of In-Sheet face Switching (IPS) mode or Fringe Field Switching (FFS) mode.

(29) In the foregoing embodiments, a liquid crystal panel is used as the display panel. It is also possible to use a Micro Electro Mechanical Systems (MEMS) display panel, for example, in which light from, a backlight device is utilized to display an image. The MEMS display panel has a number of fine mechanical shutters forming display pixels two-dimensionally arranged in a matrix. The opening and closing of the mechanical shutters are individually controlled to adjust the amount of transmitted light of the light from the backlight device on a display pixel by pixel basis, whereby a predetermined grayscale image can be displayed.

EXPLANATION OF SYMBOLS

10: Liquid crystal display device (Display device)
11: Liquid crystal panel (Display panel)
12, 412: Backlight device (Lighting device)
14, 314: Light guide plate
17, 117, 317, 517, 617: LED (Light source)
18, 118, 218, 318, 418, 518, 618, 718, 818: LED board (Light source board)
18a, 118a, 218a, 318a, 418a, 518a, 618a, 718a, 818a: Board body
18b, 118b, 218b, 418b, 518b, 618b, 718b: Extended portion
18c, 518c, 618c: Wiring portion
20, 520, 620: Meandering portion (Expandable portion)
21: Slit
22, 222, 422, 522, 622, 722: First extending portion
23, 223, 423, 523, 623, 723: Second extending portion
24, 524: First wiring portion
25, 525: Second wiring portion
26, 826: Easily deformable portion (Expandable portion)
27: Recess portion
28: Light guide plate contact portion
29: Functional component
118a1, 418a1, 818a1: Both ends
NWA: No-wiring formed region

The invention claimed is:

1. A lighting device comprising at least:
a plurality of light sources arranged in an annular and curved shape;
a light guide plate surrounded by the plurality of light sources and having an outer shape along an arrangement of the plurality of light sources, the light guide plate being configured to guide light from the plurality of light sources; and
a light source board on which the plurality of light sources are mounted and a wiring portion configured to feed power to the plurality of light sources is formed, the light source board extending along the arrangement of the plurality of light sources and having a terminated annular shape or an endless annular shape, the light source board including a no-wiring formed region in a part thereof with respect to a circumferential direction, the wiring portion being not formed in the no-wiring formed region.

2. The lighting device according to claim 1, wherein the light source board has an endless annular shape, and includes at least an expandable portion in the no-wiring formed region.

3. The lighting device according to claim 2, wherein the expandable portion includes a meandering portion having a plurality of slits in the light source board and extending with meandering in the circumferential direction.

4. The lighting device according to claim 2, wherein the light source board includes a board body extending along the arrangement of the plurality of light sources and having a terminated annular shape, and
an easily deformable portion connecting both ends of the board body and made of a material more easily deformable than a material of the board body, and
the expandable portion includes the easily deformable portion.

5. The lighting device according to claim 4, wherein the easily deformable portion is made of an elastic material that is elastically expandable and contractible.

6. The lighting device according to claim 1, wherein the light source board has a terminated annular shape, and the no-wiring formed region is sandwiched between both ends of the light source board.

7. The lighting device according to claim 6, further comprising functional components including an imaging element, a sensor, a switch, and a connector,
wherein the functional components are housed in the no-wiring formed region sandwiched between the both ends of the light source board.

8. The lighting device according to claim 1, wherein the light source board includes at least
a board body having a terminated annular shape or an endless annular shape that is along the arrangement of the plurality of light sources, the board body having the plurality of light sources and the wiring portion thereon, and
an extended portion extending in a radial direction from a part of the board body with respect to the circumferential direction, the extended portion having the wiring portion; and
the board body includes the no-wiring formed region in a position directly opposite from the extended portion with respect to the circumferential direction.

9. The lighting device according to claim 8, wherein
the extended portion extends from the board body outward in the radial direction, and
the board body includes a recess portion in a part of the board body with respect to the circumferential direction where the extended portion is led out, the recess portion being formed by recessing an inner edge portion of the part.

10. The lighting device according to claim 1, wherein the light source board includes a light guide plate contact portion disposed more inside than the light source with respect to the radial direction, the light guide plate contact portion being to be in contact with the light guide plate.

11. The lighting device according to claim 10, wherein the light guide plate contact portion is disposed between the light sources adjacent to each other with respect to the circumferential direction.

12. The lighting device according to claim 10, wherein a plurality of the light guide plate contact portions are disposed so as to sandwich one of the light sources with respect to the circumferential direction.

13. The lighting device according to claim 1, wherein the light source board includes at least
a board body having a terminated annular shape or an endless annular shape that is along the arrangement of the plurality of light sources, the board body having the plurality of light sources and the wiring portion thereon, and
an extended portion extending in a radial direction from a part of the board body with respect to the circumferential direction, and having the wiring portion, and
the board body includes a first extending portion and a second extending portion extending in the circumferential direction from a part where the extended portion is led out to the no-wiring formed region, and
the wiring portion includes a first wiring portion disposed on the first extending portion and a second wiring portion disposed on the second extending portion.

14. The lighting device according to claim 13, wherein the wiring portion includes a plurality of the first wiring portions and a plurality of the second wiring portions.

15. A display device comprising:
   the lighting device according to claim 1; and
   a display panel configured to perform a display by utilizing light from the lighting device.

* * * * *